(12) United States Patent
Gluschenkov et al.

(10) Patent No.: US 10,586,769 B2
(45) Date of Patent: Mar. 10, 2020

(54) CONTACT FORMATION IN SEMICONDUCTOR DEVICES

(71) Applicant: INTERNATIONAL BUSINESS MACHINES CORPORATION, Armonk, NY (US)

(72) Inventors: Oleg Gluschenkov, Tannersville, NY (US); Jiseok Kim, Allentown, PA (US); Zuoguang Liu, Schenectady, NY (US); Shogo Mochizuki, Clifton Park, NY (US); Hiroaki Niimi, Cohoes, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/226,911

(22) Filed: Dec. 20, 2018

(65) Prior Publication Data
US 2019/0148299 A1    May 16, 2019

Related U.S. Application Data

(62) Division of application No. 15/466,382, filed on Mar. 22, 2017, now Pat. No. 10,347,581.

(51) Int. Cl.
*H01L 23/535* (2006.01)
*H01L 29/417* (2006.01)
(Continued)

(52) U.S. Cl.
CPC ...... *H01L 23/535* (2013.01); *H01L 21/26506* (2013.01); *H01L 21/324* (2013.01);
(Continued)

(58) Field of Classification Search
CPC ............ H01L 21/324; H01L 21/76802; H01L 21/76877; H01L 21/76895; H01L 23/535; H01L 29/41725; H01L 29/41783
(Continued)

(56) References Cited

U.S. PATENT DOCUMENTS 8,367,528 B2    2/2013  Bauer et al.
9,171,929 B2   10/2015  Lee et al.
(Continued)

FOREIGN PATENT DOCUMENTS

WO    2015142357 A1    9/2015

OTHER PUBLICATIONS

List of IBM Patents or Patent Applications Treated as Related; (Appendix P), Filed Dec. 20, 2018; 2 pages.
(Continued)

*Primary Examiner* — Matthew E Warren
(74) *Attorney, Agent, or Firm* — Cantor Colburn LLP; Vazken Alexanian

(57) ABSTRACT

A technique relates to fabricating a semiconductor device. A contact trench is formed in an inter-level dielectric layer. The contact trench creates an exposed portion of a semiconductor substrate through the inter-level dielectric layer. A gate stack is on the semiconductor substrate, and the inter-level dielectric layer is adjacent to the gate stack and the semiconductor substrate. A source/drain region is formed in the contact trench such that the source/drain region is on the exposed portion of the semiconductor substrate. Tin is introduced in the source/drain region to form an alloyed layer on top of the source/drain region, and the alloyed layer includes the tin and a source/drain material of the source/drain region. A trench layer is formed in the contact trench such that the trench layer is on top of the alloyed layer. A metallic liner layer is formed on the trench layer and the inter-level dielectric layer.

20 Claims, 26 Drawing Sheets

(51) Int. Cl.
*H01L 21/324* (2006.01)
*H01L 21/768* (2006.01)
*H01L 29/78* (2006.01)
*H01L 29/66* (2006.01)
*H01L 21/265* (2006.01)
*H01L 29/06* (2006.01)
*H01L 21/285* (2006.01)

(52) U.S. Cl.
CPC .. *H01L 21/76802* (2013.01); *H01L 21/76843* (2013.01); *H01L 21/76877* (2013.01); *H01L 21/76895* (2013.01); *H01L 29/4175* (2013.01); *H01L 29/41791* (2013.01); *H01L 29/66795* (2013.01); *H01L 29/785* (2013.01); *H01L 21/28518* (2013.01); *H01L 21/76897* (2013.01); *H01L 29/0653* (2013.01); *H01L 29/66545* (2013.01)

(58) Field of Classification Search
USPC .................. 438/586, 597, 658–660, 675; 257/742–744, 748
See application file for complete search history.

(56) References Cited

U.S. PATENT DOCUMENTS

| | | | |
|---|---|---|---|
| 9,224,735 | B2 | 12/2015 | Glass et al. |
| 9,502,309 | B1 | 11/2016 | Cheng et al. |
| 2004/0082168 | A1 | 4/2004 | Lee et al. |
| 2007/0138564 | A1 | 6/2007 | Lim et al. |
| 2007/0170588 | A1 | 7/2007 | Goto et al. |
| 2009/0209096 | A1* | 8/2009 | Lee .................. H01L 21/28518 438/586 |
| 2010/0123198 | A1 | 5/2010 | Kim et al. |
| 2011/0057317 | A1* | 3/2011 | Koike .............. H01L 21/28518 257/751 |
| 2011/0068407 | A1 | 3/2011 | Yeh et al. |
| 2012/0211808 | A1 | 8/2012 | Wei et al. |
| 2013/0154016 | A1 | 6/2013 | Glass et al. |
| 2013/0183814 | A1 | 7/2013 | Huang et al. |
| 2014/0001520 | A1* | 1/2014 | Glass ................ H01L 29/66439 257/288 |
| 2014/0008730 | A1 | 1/2014 | Mitard et al. |
| 2014/0183645 | A1 | 7/2014 | Wann et al. |
| 2016/0111537 | A1 | 4/2016 | Tsai et al. |
| 2016/0181424 | A1* | 6/2016 | Rios .................... H01L 29/0847 257/192 |
| 2017/0256624 | A1 | 9/2017 | Lee et al. |
| 2018/0005903 | A1 | 1/2018 | Basker et al. |
| 2018/0277483 | A1 | 9/2018 | Gluschenkov et al. |
| 2018/0277541 | A1 | 9/2018 | Gluschenkov et al. |

OTHER PUBLICATIONS

Driesch et al., "Direct Bandgap Group IV Epitaxy on Si for Laser Applications", Chemistry of Materials, ACS Publications, American Chemical Society, DOI: 10.1021/acs.chemmater.5b01327, pp. 1-10.

Giubertoni et al., "Solid Phase Epitaxial Re-Growth Of Sn Ion Implanted Germanium Thin Films", Proc. AIP Conference, vol. 1496, 2012, pp. 103-106.

Gupta et al., "7-nm FinFET CMOS Design Enabled by Stress Engineering Using Si, Ge, and Sn", IEEE Transactions on Electron Devices, vol. 61, No. 5, May 2014, pp. 1222-1230.

Gupta et al., "GeSn channel nMOSFETs: Material Potential and Technological Outlook", Proc. IEEE Symposium on VLSI Technology (VLSIT), 2012, pp. 95-96.

List of IBM Patents or Patent Applications Treated as Related; (Appendix P), Filed Mar. 28, 2019; 2 pages.

Oleg Gluschenkov et al., "Contact Formation in Semiconductor Devices," U.S. Appl. No. 16/365,913, filed Mar. 27, 2019.

Secchi et al., "Ge nanostructuring by Sn ion implantation", Proc. IEEE 15th Intl. Conf. on Nanotechnology(IEEE-Nano), Jul. 27-30, 2015, Rome, Italy, pp. 522-525.

Trumbore, "Solid Solubilities of Impurity Elements in Germanium and Silicon", The Bell System Technical Journal, Jan. 1960, pp. 1-29.

Chang, et al., "Tensile-Strained Ge/SiGeSn Quantum Wells for Polarization-Insensitive Electro-Absorption Waveguide Modulators," IEEE Journal of Quantum Electronics, vol. 48, No. 4, Apr. 2012, pp. 533-541.

* cited by examiner

CONTACT FORMATION IN SEMICONDUCTOR DEVICES

DOMESTIC PRIORITY

This application is a divisional of U.S. application Ser. No. 15/466,382, titled "CONTACT FORMATION IN SEMICONDUCTOR DEVICES" filed Mar. 22, 2017, the contents of which are incorporated by reference herein in its entirety.

BACKGROUND

The present invention generally relates to complimentary metal-oxide semiconductors (CMOS) and metal-oxide-semiconductor field-effect transistors (MOSFET), and more specifically, to contact formation during geometrically-scaled FET device fabrication.

The MOSFET is a transistor used for switching electronic signals. The finFET is a multiple-gate MOSFET device that mitigates the effects of short channels and reduces drain-induced barrier lowering. Due to improved short channel effects, the finFET is a widely used form of geometrically-scaled FETs. The word "fin" refers to a generally fin-shaped semiconductor structure patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length (gate width) can be achieved in a given region of the substrate as opposed to a planar FET device. However, geometrically-scaled FETs suffer from increased series, parasitic resistance. A large component of this parasitic resistance is the contact resistance between metallic interconnects and a semiconductor material of FET body. There is a continuous need for novel techniques and structures enabling lower contact resistance for geometrically-scaled FETs.

SUMMARY

According to one or more embodiments, a method for fabricating a semiconductor device is provided. The method includes forming a contact trench in an inter-level dielectric layer, where the contact trench creates an exposed portion of a semiconductor substrate through the inter-level dielectric layer. The gate stack is on the semiconductor substrate, and the inter-level dielectric layer is adjacent to the gate stack and the semiconductor substrate. The method includes forming a trench source/drain region in the contact trench such that the trench source/drain region is on the exposed portion of the semiconductor substrate and introducing tin in the trench source/drain region to form an alloyed layer on top of the trench source/drain region. The alloyed layer includes the tin and a source/drain material of the trench source/drain region. Also, the method includes forming a trench layer in the contact trench such that the trench layer is on top of the alloyed layer and forming a metallic liner layer on the trench layer and the inter-level dielectric layer.

According to one or more embodiments, a method for fabricating a semiconductor device is provided. The method includes forming a contact trench in an inter-level dielectric layer, where the contact trench creates an exposed portion of a semiconductor substrate through the inter-level dielectric layer. A gate stack is on the semiconductor substrate, and the inter-level dielectric layer is adjacent to the gate stack and the semiconductor substrate. The method includes forming a trench source/drain region in the contact trench such that the trench source/drain region is on the exposed portion of the semiconductor substrate and forming a trench layer in the contact trench such that the trench layer is on top of the trench source drain region. Also, the method includes introducing tin through the trench layer to form an alloyed layer between the trench source/drain region and the trench layer, where the alloyed layer includes the tin and a source/drain material of the trench source/drain region. Further, the method includes forming a metallic liner layer on the trench layer and the inter-level dielectric layer.

According to one or more embodiments, a semiconductor device is provided. The semiconductor device includes an inter-level dielectric layer having a contact trench creating an exposed portion of a semiconductor substrate through the inter-level dielectric layer. A gate stack is on the semiconductor substrate, and the inter-level dielectric layer is adjacent to the gate stack and the semiconductor substrate. The semiconductor device includes a trench source/drain region in the contact trench such that the trench source/drain region is on the exposed portion of the semiconductor substrate. The semiconductor device includes an alloyed layer on top of the trench source/drain region, where the alloyed layer includes tin and a source/drain material of the trench source/drain region. Further, the semiconductor device includes a trench layer in the contact trench such that the trench layer is on top of the alloyed layer and a metallic liner layer on the trench layer and the inter-level dielectric layer.

BRIEF DESCRIPTION OF THE DRAWINGS

FIGS. 1-15 illustrate an exemplary method for forming a FET device having reduced external resistance.

FIG. 1 illustrates a side view of a wafer that includes a semiconductor layer (substrate) and a sacrificial hardmask arranged on the semiconductor substrate.

FIG. 3 illustrates a cut-away view following the formation of a shallow trench isolation (STI) region adjacent to the fins.

FIG. 6 illustrates a top view of the resultant structure following the removal of the sacrificial gates (of FIG. 5B) to form cavities that expose the channel regions of the fins.

FIG. 7 illustrates a top view of the resultant structure following the formation of a replacement metal gate stack (gate stack).

FIG. 9 illustrates a cut-away view following the formation of trench source/drain regions.

FIG. 10 illustrates a cut-away view following an ion implantation process that implants tin (Sn) ions into the source/drain region to form a tin-alloyed layer.

FIG. 11 illustrates a cut-away view following the formation of a trench Ge layer.

FIG. 12 illustrates a cut-away view following an implantation process, a Ga or Al implantation process and a solid or liquid phase epitaxy process that re-crystalizes and anneals the trench Ge layer.

FIG. 13 illustrates a cut-away view following the deposition of a metallic liner layer over exposed portions of the inter-level dielectric layer and over the trench layer in the cavities.

FIG. 14 illustrates a cut-away view of the resultant structure following the deposition of a conductive contact material over the liner layer.

FIG. 15 illustrates a cut-away view following a planarization process that removes overburdened materials and forms conductive contacts.

FIG. 16 illustrates a cut-away view following the formation of trench source/drain region in the cavities.

FIG. 17 illustrates a cut-away view following the deposition of a trench Ge layer over the source/drain regions in the cavities.

FIG. 18 illustrates a cut-away view following a tin (Sn) ion implantation process that implants ions into the source/drain region to form an alloyed layer.

FIG. 19 illustrates a cut-away view of the resultant structure following an additional implantation process, a Ga or Al implantation process and a solid phase epitaxy process that re-crystalizes and anneals the trench layers.

FIG. 20 illustrates a cut-away view following the deposition of a metallic liner layer over exposed portions of the inter-level dielectric layer and over the trench Ge layer in the cavities.

FIG. 21 illustrates a cut-away view of the resultant structure following the deposition of a conductive contact material over the liner layer.

FIG. 22 illustrates a cut-away view following a planarization process that removes overburdened materials and forms conductive contacts.

DETAILED DESCRIPTION

Figure 1:
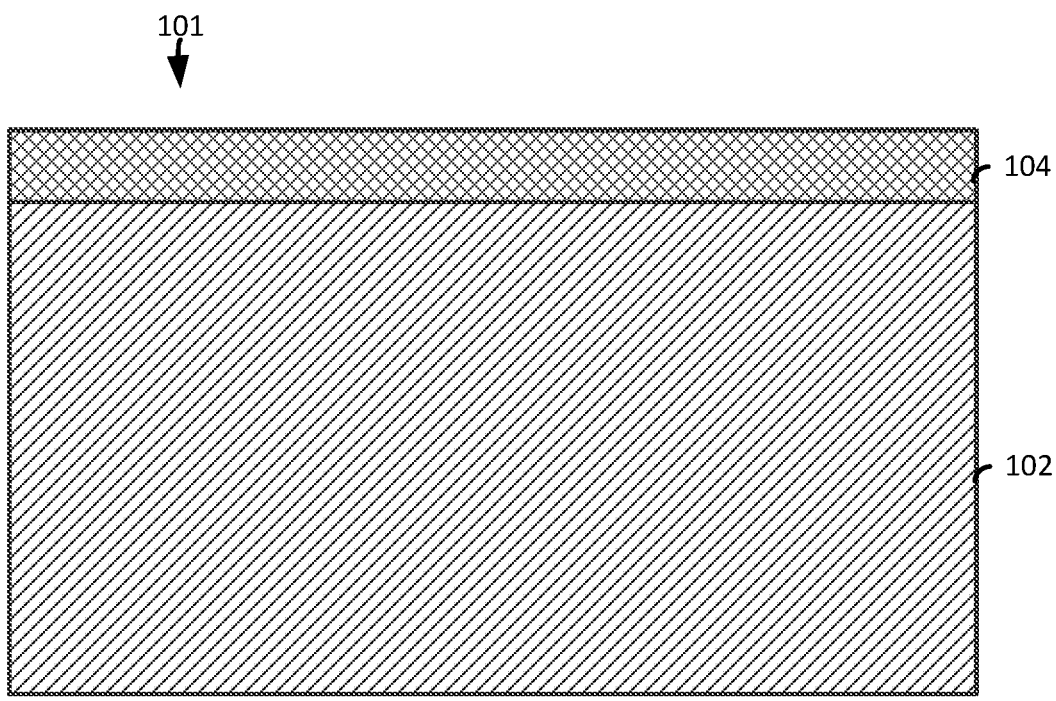

As previously noted herein, the MOSFET is a transistor used for switching electronic signals. The MOSFET has a source, a drain and a gate electrode. The metal gate is electrically insulated from the main semiconductor n-channel or p-channel by a thin layer of insulating material, for example, silicon dioxide or high dielectric constant (high-k) dielectrics, which makes the input resistance of the MOSFET relatively high. The gate voltage controls whether the path from drain to source is an open circuit ("off") or a resistive path ("on").

N-type field effect transistors (nFET) and p-type field effect transistors (pFET) are two types of complementary MOSFETs. The nFET has n-doped source and drain junctions and uses electrons as the current carriers. The pFET has p-doped source and drain junctions and uses holes as the current carriers.

The finFET is a type of MOSFET. The finFET is a multiple-gate MOSFET device that mitigates the effects of short channels and reduces drain-induced barrier lowering. The word "fin" refers to a generally fin-shaped semiconductor structure patterned on a substrate that often has three exposed surfaces that form the narrow channel between source and drain regions. A thin dielectric layer arranged over the fin separates the fin channel from the gate. Because the fin provides a three dimensional surface for the channel region, a larger channel length can be achieved in a given region of the substrate as opposed to a planar FET device. Due to improved short channel effects, the finFET is a widely used form of geometrically-scaled FETs.

Gate spacers form an insulating film along the gate sidewalls. Gate spacers can also initially be formed along sacrificial gate sidewalls in replacement gate technology. The gate spacers are used to define source/drain regions in active areas of a semiconductor substrate located adjacent to the gate.

The source/drain regions are often formed using a highly doped semiconductor material. The choice of source/drain semiconductor material is dictated by two factors (1) its compatibility with the transistor channel and (2) minimizing series resistance within the source/drain material. Device scaling in the semiconductor industry reduces costs per transistor, decreases power consumption and provides faster devices with increased functions per unit area. Improvements in optical lithography used to play a major role in device scaling enabling smaller geometrical features. However, increases in parasitic resistance and capacitance associated with the smaller geometrical features reduced or eliminated the positive effects of purely geometrical scaling. Materials advances directed toward reducing parasitic components of resistance and capacitance are now an integral part of device scaling.

In any FET device, a conductive contact is formed to the source/drain regions to connect the FET device to a circuit. The conductive contact is often formed by forming a trench in an insulator layer to expose the source/drain region. The trench is often formed using an etching process that can damage the underlying substrate while removing portions of the insulator layer. There are several material interfaces within the contact structures. Each of these interfaces creates free carrier scattering and introduces a resistance to the current flow. This interfacial resistance is often referred to as the contact resistance. A typical contact resistance of metal-metal interfaces is from $10^{-10}$ to $10^{-11}$ Ohm-cm$^2$. A typical contact resistance of metal-semiconductor interfaces is from $10^{-7}$ to $10^{-9}$ Ohm-cm$^2$. A typical contact resistance of semiconductor-semiconductor interfaces is from $10^{-9}$ to $10^{-10}$ Ohm-cm$^2$. Accordingly, the main effort has been directed toward reducing metal-semiconductor contact resistance.

In previous p-finFET devices, a source/drain region is formed by epitaxially growing a SiGe material on the exposed fins. A trench Ge material can be formed over the SiGe material that provides a unipolar heterojunction interface between the SiGe material and the Ge material, which is a semiconductor-semiconductor interface. The trench Ge material enables a lower semiconductor-metal interfacial (contact) resistance due to metal Fermi level pinning to Ge valence band. However, the valance band offset between the SiGe material and the Ge material undesirably increases the interfacial (contact) resistance between the SiGe and Ge material.

The illustrated exemplary methods and embodiments described herein provide for the formation of a contact over the source/drain regions of a pFET device. The trench source/drain regions are alloyed with tin (Sn) that reduces the valence band offset between the doped SiGe material and the Ge material, which reduces the overall external resistance of the device.

FIGS. 1-15 illustrate an exemplary method for forming a pFET device having reduced external resistance.

FIG. 1 illustrates a side view of a wafer 101 that includes a semiconductor layer (substrate) 102 and a sacrificial hardmask 104 arranged on the semiconductor substrate 102. In an alternate exemplary embodiment, a semiconductor on insulator substrate can be used.

Non-limiting examples of suitable materials for the semiconductor layer 102 include Si (silicon), strained Si, SiC (silicon carbide), Ge (germanium), SiGe (silicon germanium), SiGeC (silicon-germanium-carbon), Si alloys, Ge alloys, III-V materials (e.g., GaAs (gallium arsenide), InAs (indium arsenide), InP (indium phosphide), or aluminum arsenide (AlAs)), II-VI materials (e.g., CdSe (cadmium selenide), CdS (cadmium sulfide), CdTe (cadmium telluride), ZnO (zinc oxide), ZnSe (zinc selenide), ZnS (zinc sulfide), or ZnTe (zinc telluride)), or any combination thereof. Other non-limiting examples of semiconductor materials include III-V materials, for example, indium phosphide (InP), gallium arsenide (GaAs), aluminum arsenide (AlAs), or any combination thereof. The III-V materials can include at least one "III element," such as aluminum (Al), boron (B), gallium (Ga), indium (In), and at least one "V element," such as nitrogen (N), phosphorous (P), arsenic (As), antimony (Sb).

The hardmask layer 104 arranged on the semiconductor substrate 102 can include, for example, silicon oxide, silicon nitride (SiN), SiOCN, SiBCN or any suitable combination of those. The hardmask layer 104 can be deposited using a deposition process, including, but not limited to, PVD, CVD, PECVD, or any combination thereof.

Though the illustrated embodiments show a bulk semiconductor substrate 102, alternative exemplary embodiments can include a semiconductor on insulator wafer arrangement.

Figure 2A:
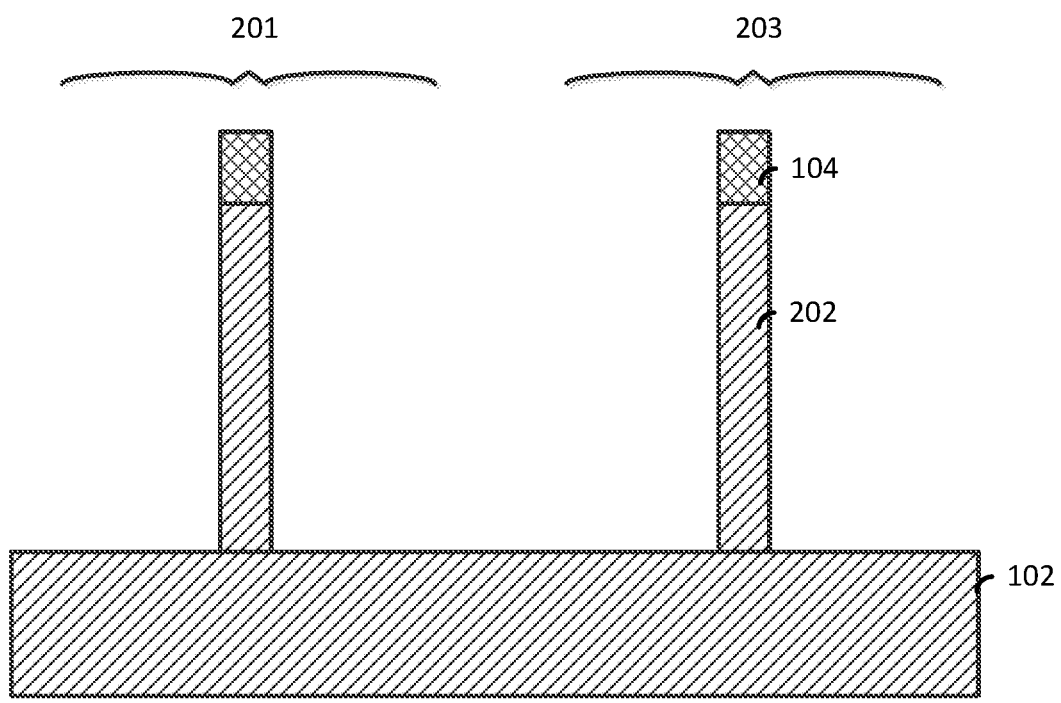
FIG. 2A illustrates a cut-away view along the line A-A (of FIG. 2B) following a lithographic patterning and etching process that forms semiconductor fins.

FIG. 2A illustrates a cut-away view along the line A-A (of FIG. 2B) following a lithographic patterning and etching process that forms semiconductor fins 202. The fins 202 are formed by, for example, a photolithographic patterning and etching process such as reactive ion etching process that patterns a resist on the hardmask 104 and removes exposed portions of the hardmask 104 and the substrate 102 to form the fins 202. In the illustrated exemplary embodiment the fins 201 will form a pFET device and the fins 203 will form an nFET device.

Figure 2B:
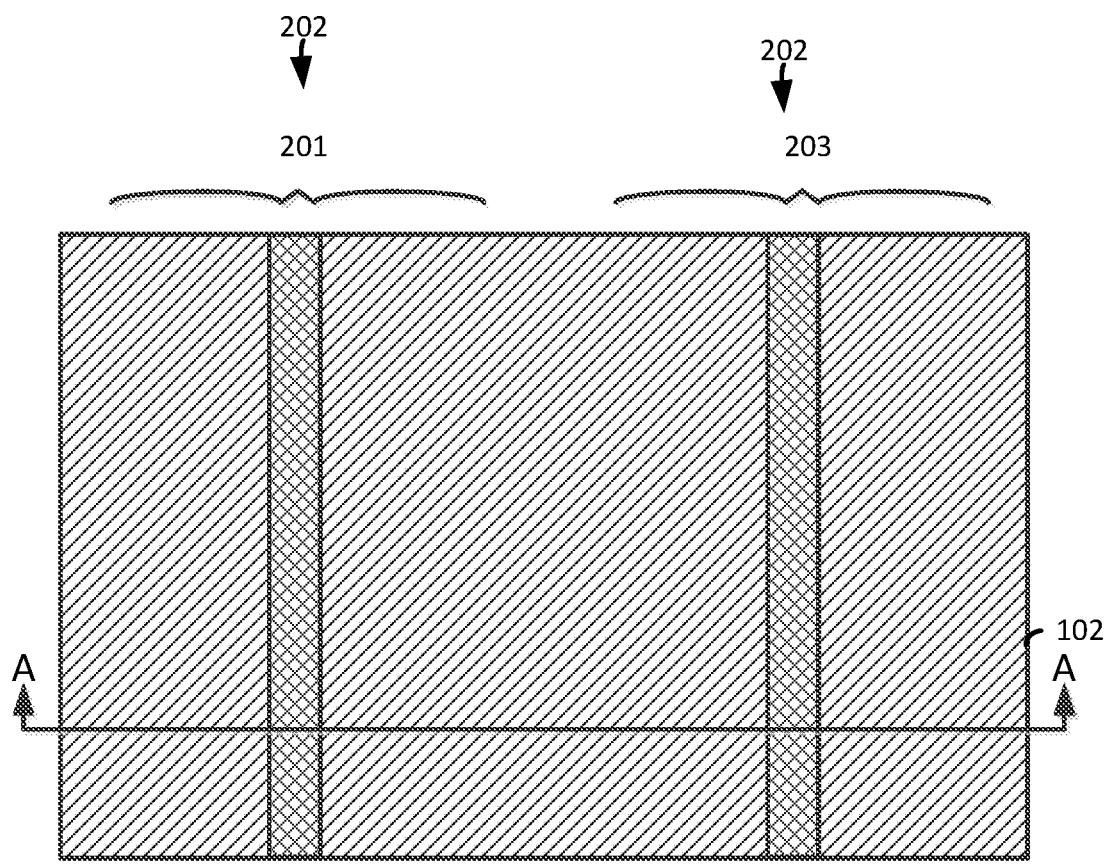
FIG. 2B illustrates a top view of the fins arranged on the substrate.

FIG. 2B illustrates a top view of the fins 202 arranged on the substrate 102.

Figure 3:
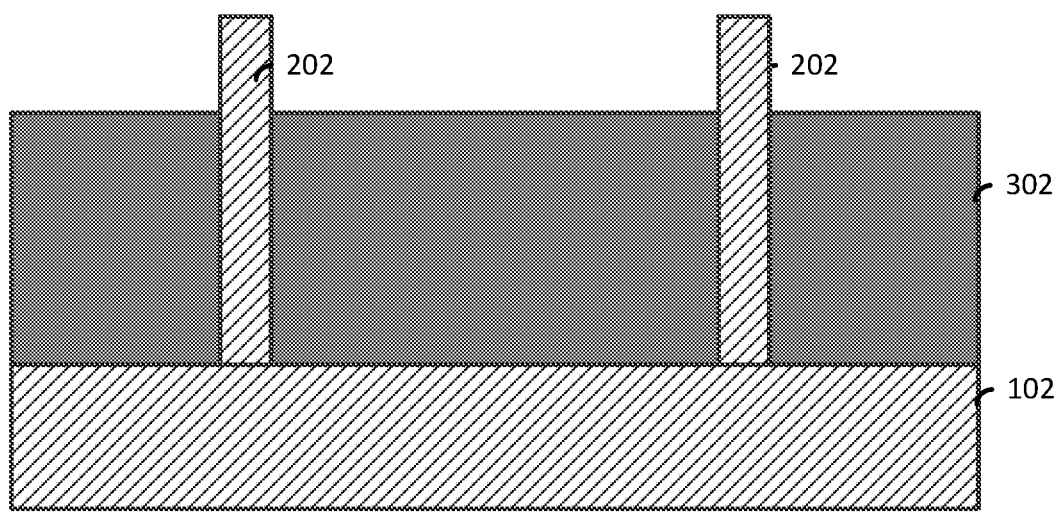

FIG. 3 illustrates a cut-away view following the formation of a shallow trench isolation (STI) region 302 adjacent to the fins 202. The STI region 302 can be formed by, any suitable process including, for example, lithography or etching to form trenches, and then filling the trenches with an insulating material, such as silicon dioxide.

In the illustrated embodiment, at least one isolation region is a shallow trench isolation region ("STI"). However, the isolation region 302 can be a trench isolation region, a field oxide isolation region (not shown), or any other type of isolation region. The isolation region 302 provides isolation between neighboring gate structure regions, and can be used when the neighboring gates have opposite conductivities, e.g., nFETs and pFETs. As such, the isolation region 302 separates an nFET device region from a pFET device region.

Figure 4A:
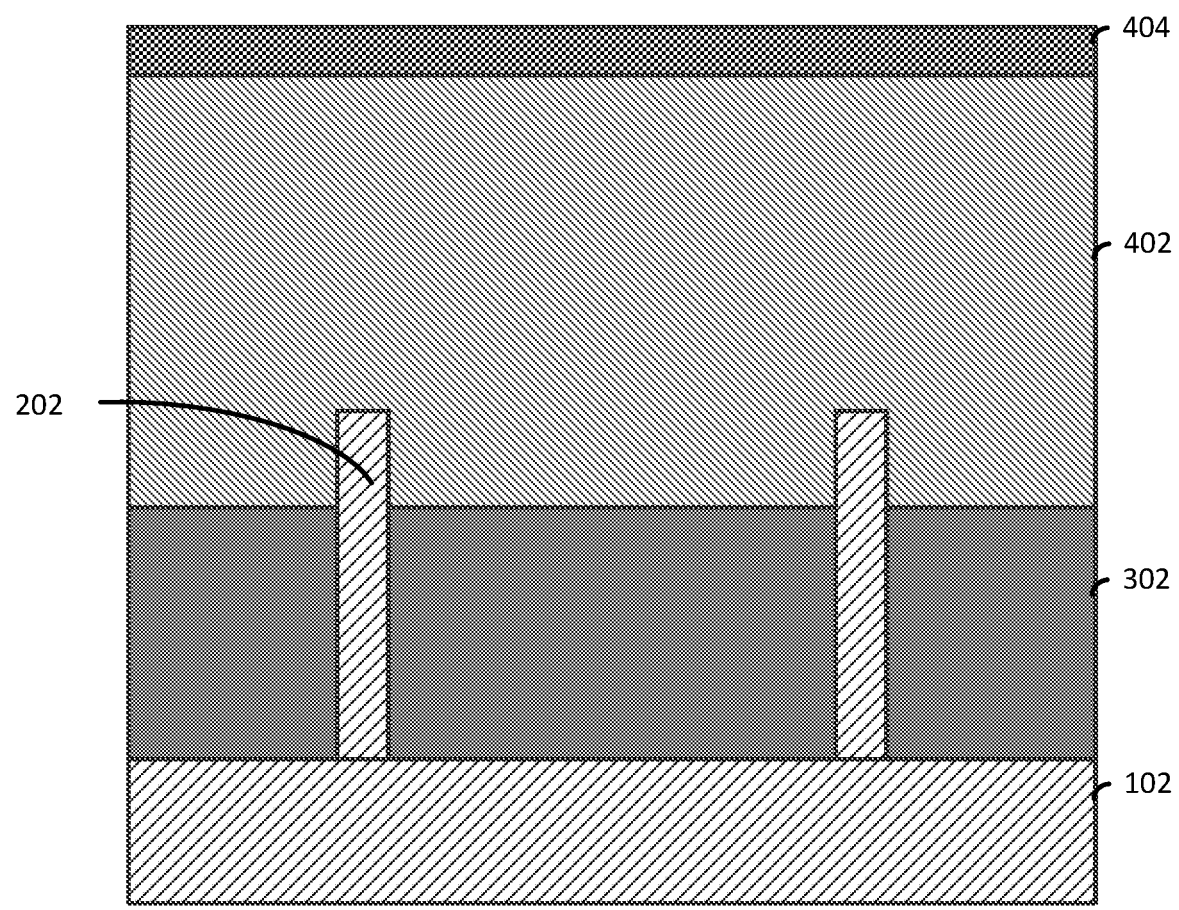
FIG. 4A illustrates a cut-away view along the line A-A (of FIG. 4B) following the formation of sacrificial gate over channel regions of the fins.

FIG. 4A illustrates a cut-away view along the line A-A (of FIG. 4B) following the formation of sacrificial gate 402 over channel regions of the fins 202 and spacers 406.

The sacrificial gate 402 in the exemplary embodiment is formed by depositing a layer (not shown) of sacrificial gate material such as, for example, amorphous silicon (aSi), or polycrystalline silicon (polysilicon) material or another suitable sacrificial gate material. The sacrificial gate 402 can further include a sacrificial gate dielectric material such as silicon oxide between the nanowires and aSi or polysilicon material.

The layer of sacrificial gate material can be deposited by a deposition process, including, but not limited to, physical vapor deposition (PVD), chemical vapor deposition (CVD), atomic layer deposition (ALD, plasma enhanced chemical vapor deposition (PECVD), inductively coupled plasma chemical vapor deposition (ICP CVD), or any combination thereof.

Following the deposition of the layer of sacrificial gate material, a hard mask layer (not shown) such as, for example, silicon oxide, silicon nitride (SiN), SiOCN, SiBCN or any suitable combination of those materials, is deposited on the layer of sacrificial gate material to form a PC hard mask or sacrificial gate cap 404. The hardmask layer can be deposited using a deposition process, including, but not limited to, PVD, CVD, PECVD, or any combination thereof.

Following the deposition of the layer sacrificial gate material and the hardmask layer, a lithographic patterning and etching process such as, for example, reactive ion etching or a wet etching process is performed to remove exposed portions of the hardmask layer and the layer of sacrificial gate material form the sacrificial gate 402 and the sacrificial gate cap 404.

Spacers 406 are formed adjacent to the sacrificial gates 402. The spacers 406 in the illustrated embodiment are formed by depositing a layer of spacer material (not shown) over the exposed portions of the fins 202 and the sacrificial gates 402.

Non-limiting examples of suitable materials for the layer of spacer material include dielectric nitrides (e.g., silicon nitride), dielectric oxynitrides, SiBCN, SiOCN, SiOC, dielectric oxides (e.g., silicon oxide), or any combination thereof. The layer of spacer material is deposited by a suitable deposition process, for example, chemical vapor deposition (CVD) or atomic layer deposition (ALD).

Figure 4B:
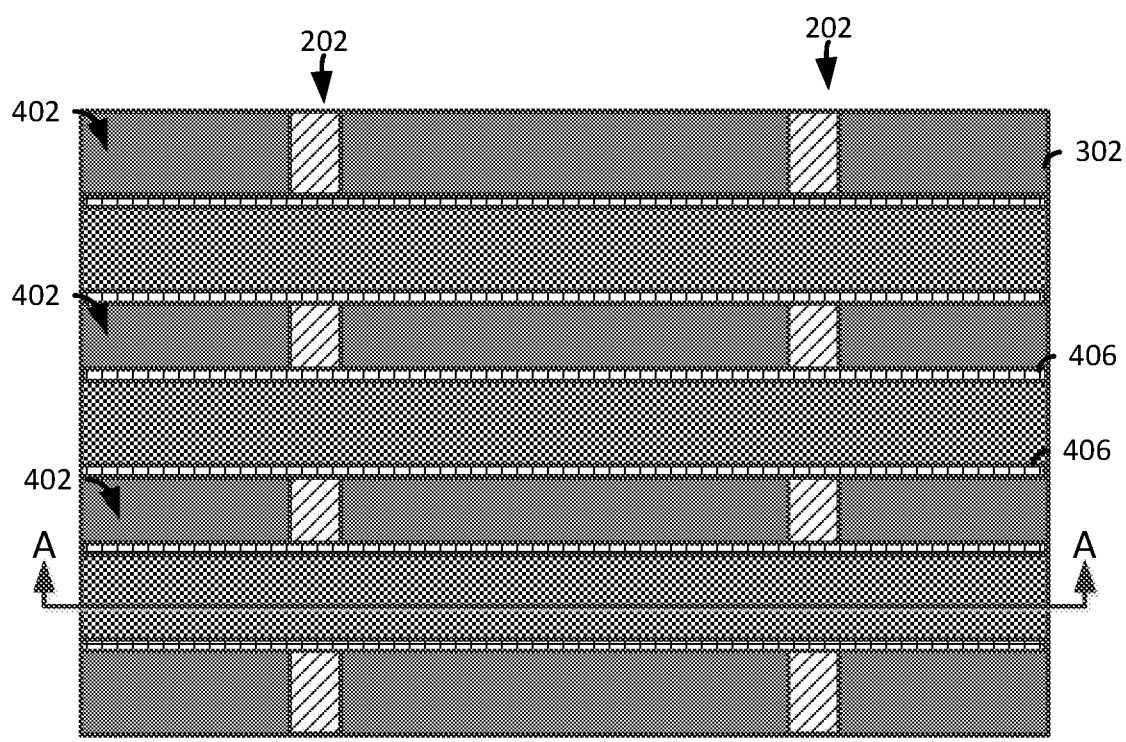
FIG. 4B illustrates a top view of the sacrificial gate.

Following the deposition of the layer of spacer material, a suitable anisotropic etching process such as, for example, a reactive ion etching process is performed to remove portions of the layer of spacer material and form the spacers 406. FIG. 4B illustrates a top view of the sacrificial gate 402 and spacers 406.

Following formation of spacers 406, the exposed fin structures 202 in between sacrificial gates 402 are enlarged to form the doped source/drain regions via an epitaxial growth process that deposits a crystalline overlayer of semiconductor material onto the exposed crystalline seed material of the exposed fin 202. In the illustrated exemplary embodiment, the source/drain region includes a doped SiGe material that can form a pFET device. The specific composition of the source/drain material is selected to enable a low-resistivity current path to and from the transistor channel. The pFET source/drain material is a highly-doped SiGe material with Ge content from about 33% to about 75%. The p-type dopant concentration in the source/drain can range from $1 \times 10^{19}$ cm$^{-3}$ to $2 \times 10^{21}$ cm$^{-3}$, or preferably (but not a necessity) between $2 \times 10^{20}$ cm$^{-3}$ and $1 \times 10^{21}$ cm$^{-3}$. The preferred p-type dopant for source/drain material is boron. The nFET source/drains are formed from another semiconductor material such as Si doped with P. In order to create both pFET and nFET source/drains using different epitaxial materials, the nFET fins are blocked with a temperature-stable hard mask preventing epitaxial deposition of SiGe:B on nFET fins and, correspondingly, the pFET fins are blocked with a complementary temperature-stable hard mask preventing epitaxial deposition of Si:P on pFET fins.

Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material includes a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Figure 5A:
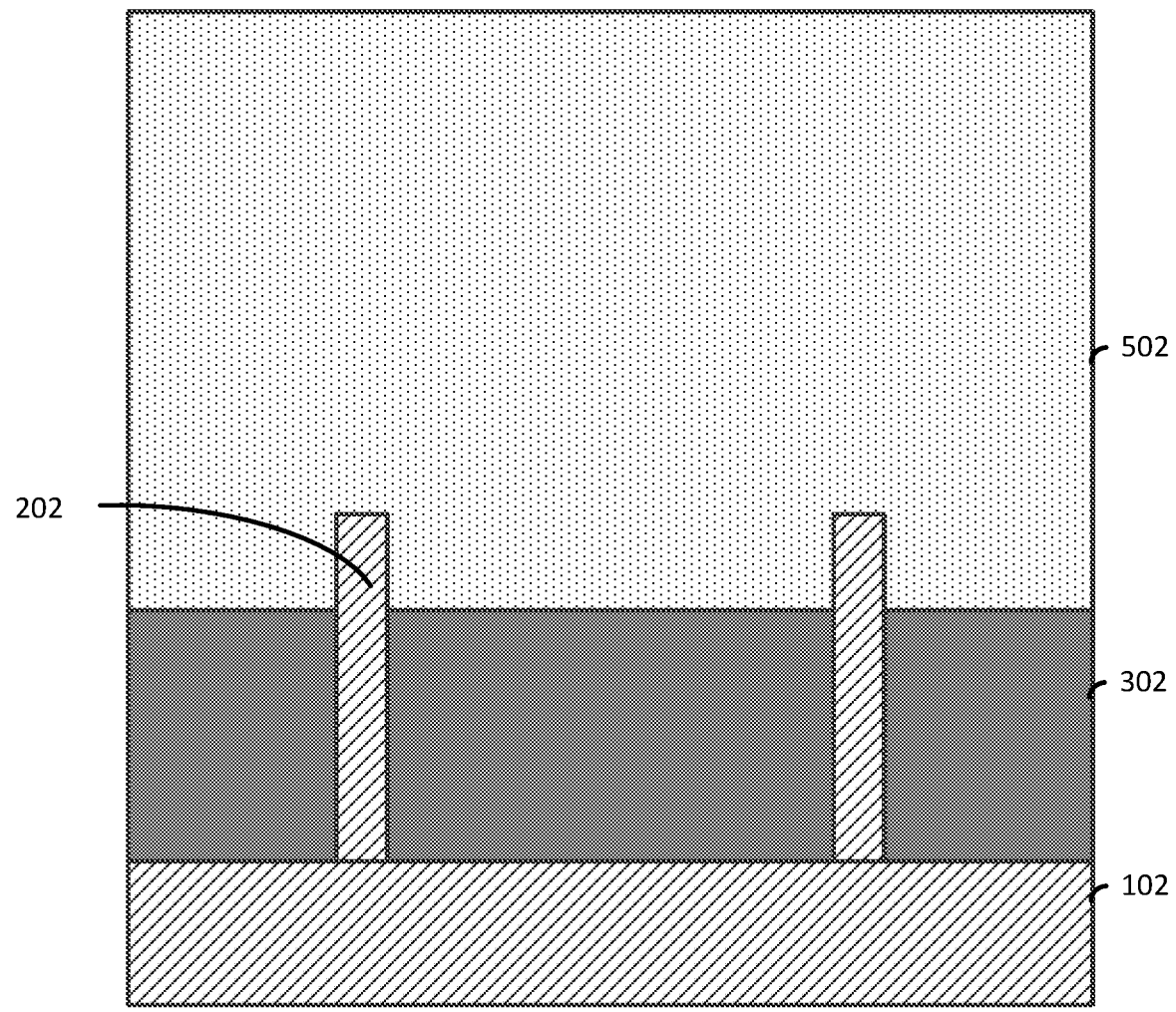
FIG. 5A illustrates a cut-away view along the line A-A (of FIG. 5B) following the formation of an inter-level dielectric layer over the fins.

FIG. 5A illustrates a cut-away view along the line A-A (of FIG. 5B) following the formation of an inter-level dielectric layer 502 over the fins 202.

The inter-level dielectric layer 502 is formed from, for example, a low-k dielectric material (with k<4.0), including but not limited to, silicon oxide, spin-on-glass, a flowable oxide, a high density plasma oxide, borophosphosilicate glass (BPSG), or any combination thereof. The inter-level dielectric layer 502 is deposited by a deposition process, including, but not limited to CVD, PVD, plasma enhanced CVD, atomic layer deposition (ALD), evaporation, chemical solution deposition, or like processes. Following the deposition of the inter-level dielectric layer 502, a planarization process such as, for example, chemical mechanical polishing is performed.

Figure 5B:
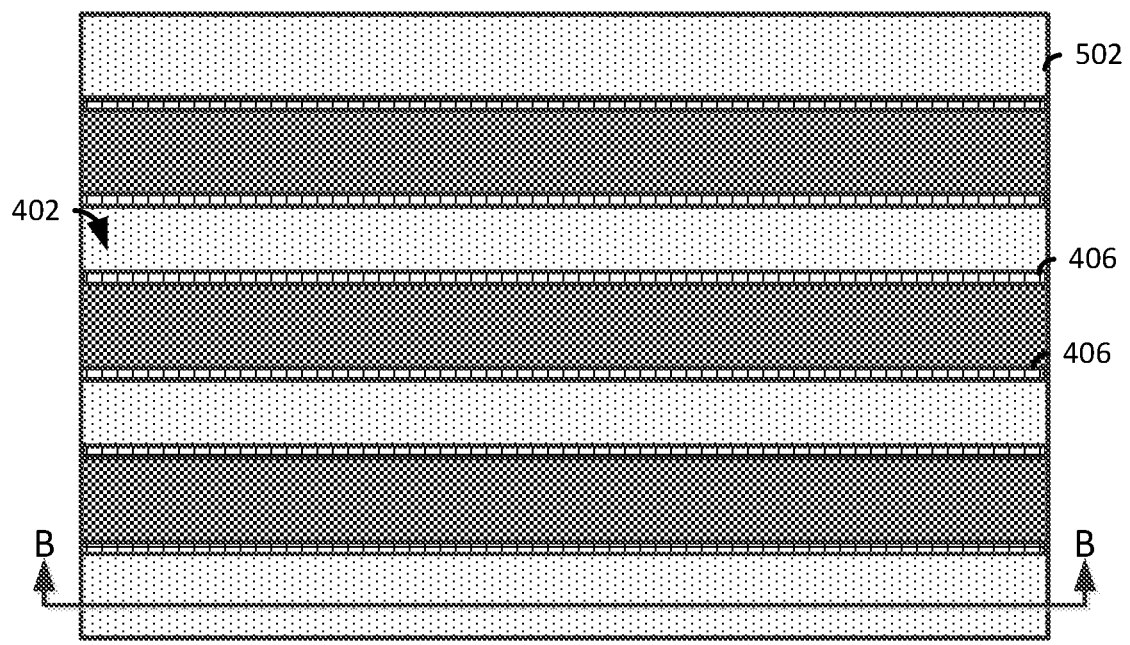
FIG. 5B illustrates a top view of the inter-level dielectric layer and the spacers arranged adjacent to the sacrificial gate.

FIG. 5B illustrates a top view of the inter-level dielectric layer 502 and the spacers 406 arranged adjacent to the sacrificial gate 402.

Figure 6:
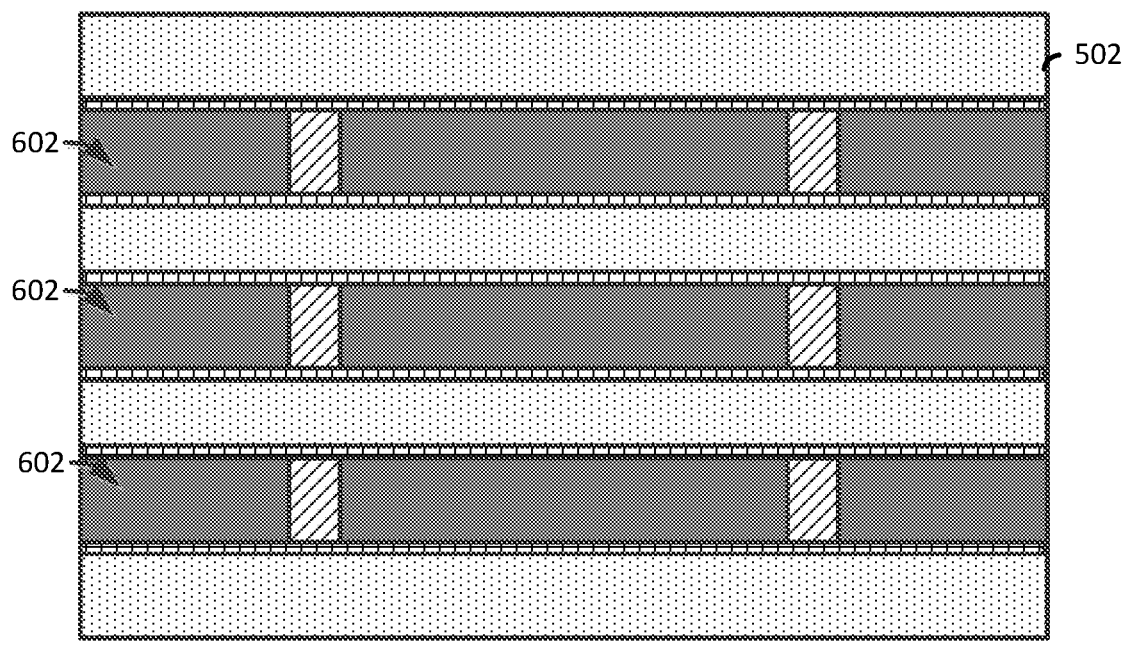

FIG. 6 illustrates a top view of the resultant structure following the removal of the sacrificial gates 402 (of FIG. 5B) to form cavities 602 that expose the channel regions of the fins 202. The sacrificial gates 402 can be removed by performing a dry etch process, for example, RIE, followed by a wet etch process. The wet etch process is selective to (will not substantially etch) the spacers 406 and the inter-level dielectric material. The chemical etch process can include, but is not limited to, hot ammonia or tetramethylammonium hydroxide (TMAH).

Figure 7:
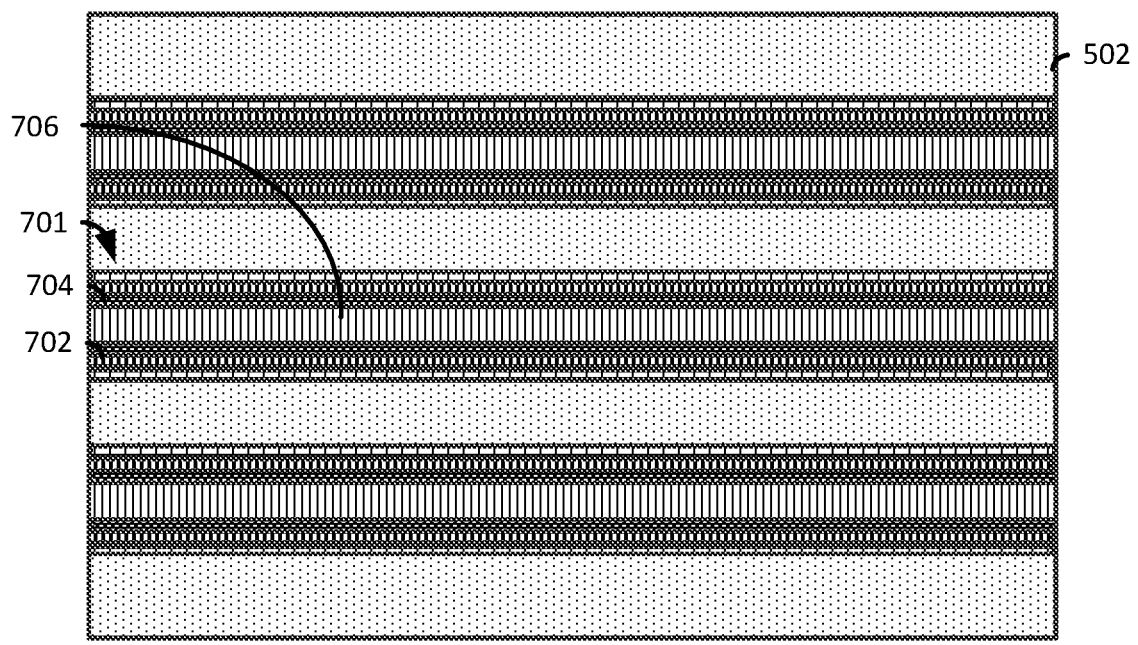

FIG. 7 illustrates a top view of the resultant structure following the formation of a replacement metal gate stack (gate stack) 701. The gate stack 701 includes high-k metal gates formed, for example, by filling the cavity 602 (of FIG. 6) with one or more gate dielectric 702 materials, one or more workfunction metals 704, and one or more metal gate conductor 706 materials. The gate dielectric 702 material(s) can be a dielectric material having a dielectric constant greater than 3.9, 7.0, or 10.0. Non-limiting examples of suitable materials for the dielectric 702 materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

The gate dielectric 702 materials can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material can vary depending on the deposition process as well as the composition and number of high-k dielectric materials used. The dielectric material layer can have a thickness in a range from about 0.5 to about 20 nm.

The work function metal(s) 704 can be disposed over the gate dielectric 702 material. The type of work function metal(s) 704 depends on the type of transistor and can differ between the nFET and pFET devices. Non-limiting examples of suitable work function metals 704 include p-type work function metal materials and n-type work function metal materials. P-type work function materials include compositions such as ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

The gate conductor 706 material(s) is deposited over the gate dielectric 702 materials and work function metal(s) 704 to form the gate stack 701. Non-limiting examples of suitable conductive metals include aluminum (Al), platinum (Pt), gold (Au), tungsten (W), cobalt (Co), titanium (Ti), or any combination thereof. The gate conductor 706 material(s) can be deposited by a suitable deposition process, for example, CVD, PECVD, PVD, plating, thermal or e-beam evaporation, and sputtering.

Following the deposition of the gate dielectric 702 materials, the work function metal(s) 704, and the gate conductor 706 material(s), planarization process, for example, chemical mechanical planarization (CMP), is performed to remove the overburden of the deposited gate materials and form the gate stack 701.

Figure 8A:
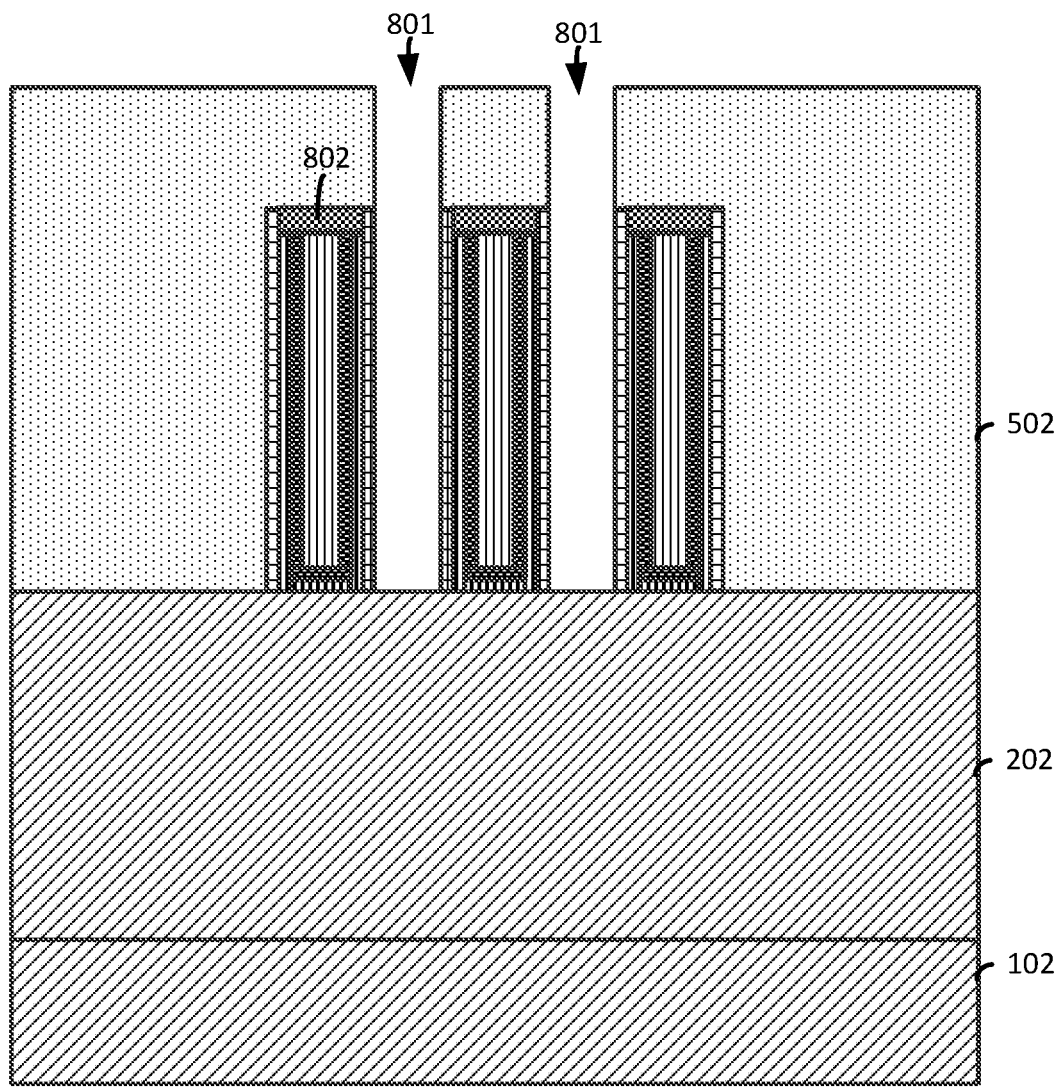
FIG. 8A illustrates a cut-away view along the line C-C (of FIG. 8B) following the removal of portions of the inter-level dielectric layer to form trenches adjacent to the spacers that expose portions of the fin and the shallow trench isolation region.

FIG. 8A illustrates a cut-away view along the line C-C (of FIG. 8B) following the removal of portions of the inter-level dielectric layer 502 to form contact trenches 801 adjacent to the spacers 502 that expose source/drain portions of the fin 202 and the shallow trench isolation region 302. A layer 802 is formed on top of the gate dielectric 702, the work function metal 704, and the gate conductor 706 material. The layer 802 is a gate cap layer, which may be an oxide, nitride, etc.

Figure 8B:
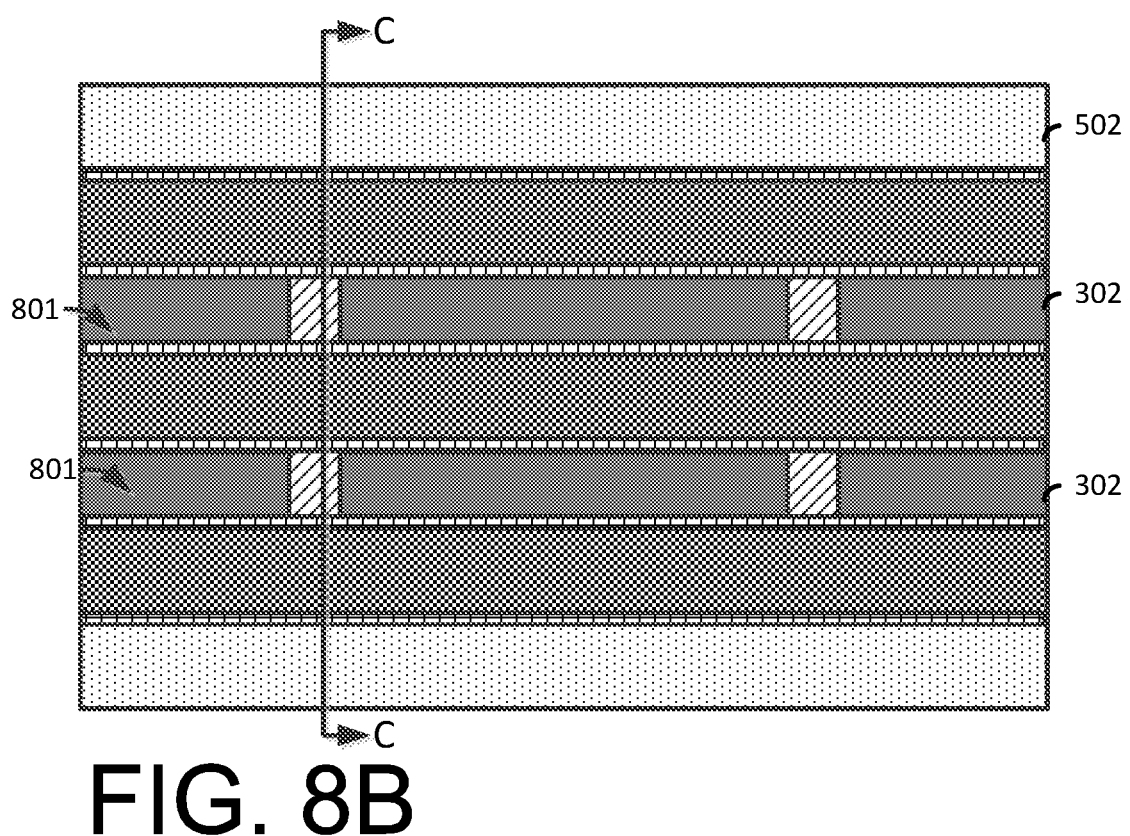
FIG. 8B illustrates a top view of the trenches.

FIG. 8B illustrates a top view of the trenches 801.

Figure 9:
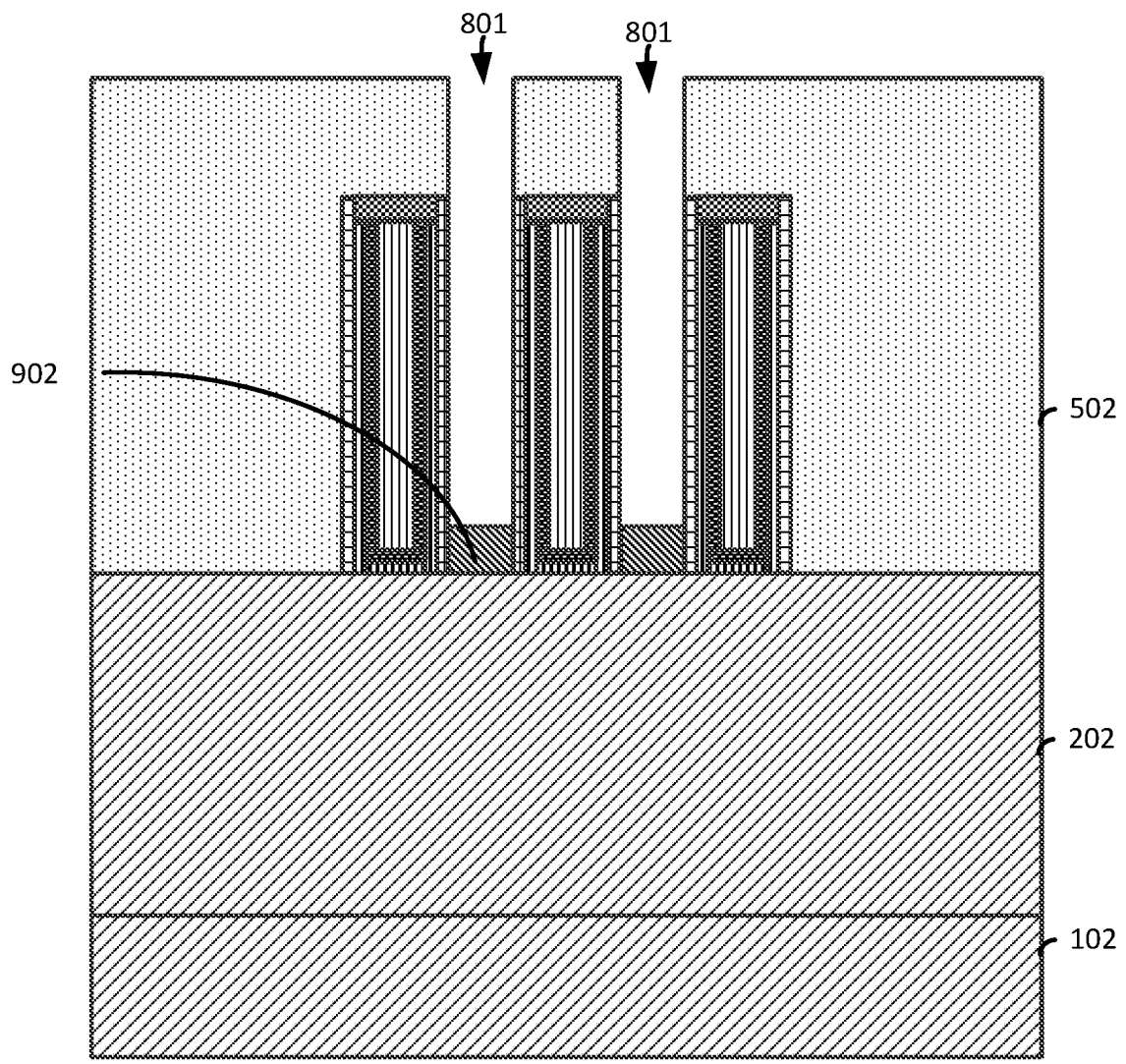

FIG. 9 illustrates a cut-away view following the formation of trench source/drain regions 902. The purpose of these trench regions 902 is to locally alter chemical composition of source/drain material to enable a low contact resistance between source/drain structures and metallic interconnects. In some embodiments, the trench source/drain regions 902 are formed by an epitaxial growth process that deposits a crystalline overlayer of semiconductor material onto the exposed crystalline seed material of the exposed source/drain regions of fin 202. In the illustrated exemplary pFET embodiment, the trench source/drain region 902 includes a doped SiGe with Ge content higher than that of fin 202 and, preferably (but not a necessity), in the range of from about 50% to about 80%.

Epitaxial material 902 can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon germanium can be doped during deposition (in-situ doped) by adding dopants p-type dopants (e.g., boron or gallium). The dopant concentration in the trench source/drain regions 902 can range from $1 \times 10^{19}$ cm$^{-3}$ to $5 \times 10^{21}$ cm$^{-3}$. In some embodiments, the gas source for the deposition of epitaxial semiconductor material include a silicon containing gas source, a germanium containing gas source, or a combination thereof. For example, Si containing gas source can be selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Ge containing gas source is selected from the group consisting of germane, digermane, halogermane, dichlorogermane, trichlorogermane, tetrachlorogermane and combinations thereof. Carrier gases like hydrogen, nitrogen, helium and argon can be used. Precursors that enable low-temperature, selective deposition are highly preferred (but not a necessity) due a temperature-sensitive gate stack 701. The temperature-sensitive gate stack 701 limits the temperature of the epitaxial process to about 550 C, with the deposition temperatures of less than 500 C being preferred. Due to this temperature limitation, a combination of silane or disilane as a silicon precursor, germane or digermane as a germanium precursor, and diborane as a boron precursor is highly preferred (but not a necessity).

Figure 10:
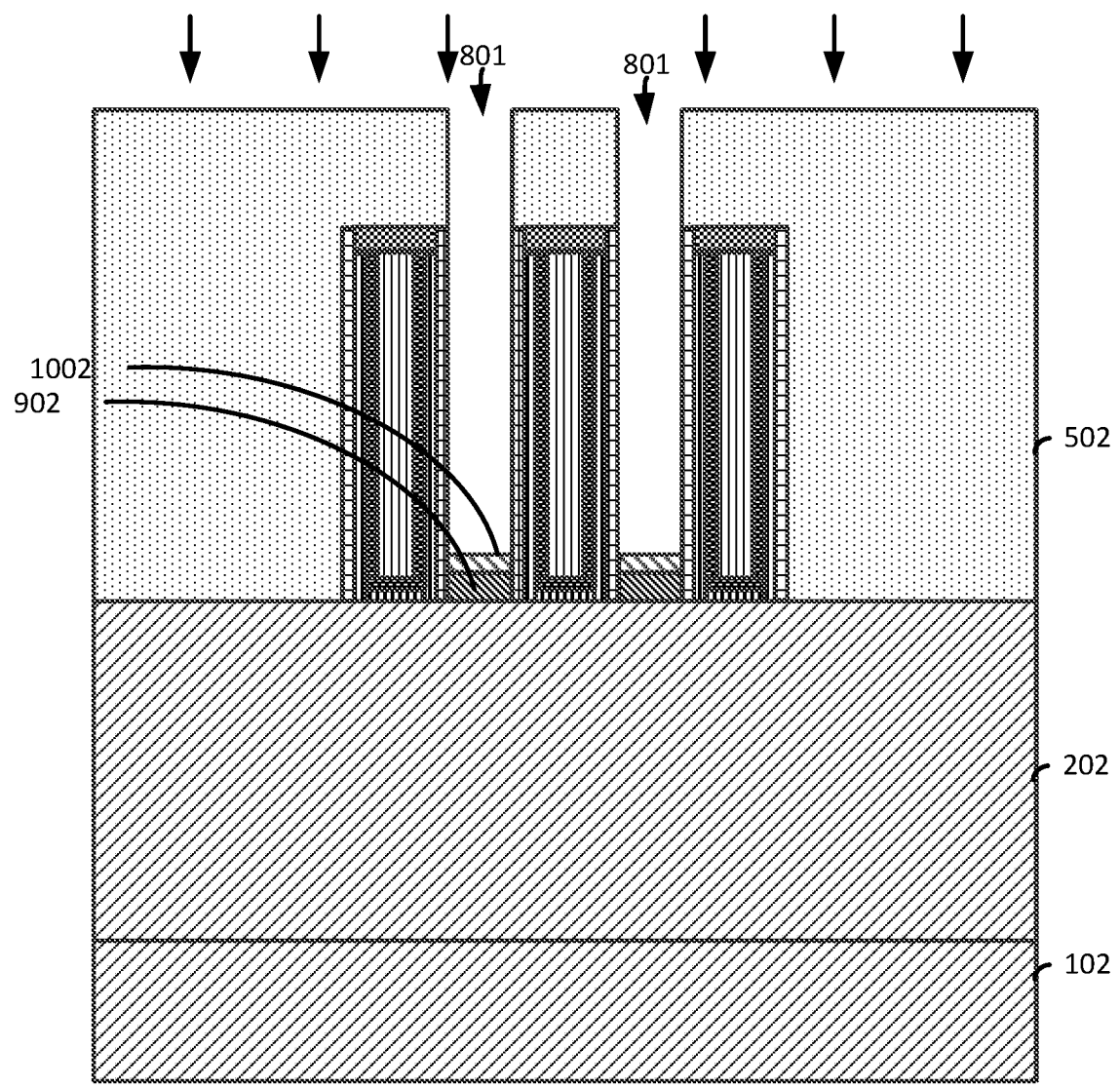

FIG. 10 illustrates a cut-away view following an ion implantation process that implants Sn ions into the trench source/drain region 902 to form an alloyed layer 1002 that includes SiGe:Sn material. The concentration of tin (Sn) in the layer 1002 is preferably graded with the higher concentration towards the surface and lower concentration into the bulk of material 1002. The preferred surface concentration of tin in layer 1002 is from 1 atomic % to 10 atomic %. This concentration grading can be accomplished via Sn ion implantation with the implantation energy from about 1 keV to about 10 keV with a range of 2 keV to 5 keV being preferred (but not a necessity). The dose of tin (Sn) ions will be from $10^{15}$ cm$^{-2}$ to $10^{16}$ cm$^{-2}$. In the illustrated exemplary embodiment, following the ion implantation process, an annealing process can be performed to form a metastable SiGeSn alloy. Tin solubility in both silicon, germanium, and silicon germanium is less than 1 atomic % resulting in tin precipitates at moderate anneal temperatures for concentration of tin exceeding solubility limit in these materials. In order to create and preserve the metastable SiGeSn alloy with the concentration of tin in the excess of its solubility a very fast annealing process must be used such as, for example, a laser annealing process that has duration of less 1 millisecond and enables crystal re-growth while preserving the metastable SiGeSn material. In some embodiments, the laser annealing process includes a nanosecond-scale laser melt annealing that liquefies tin-implanted SiGe layer with subsequent liquid phase epitaxial re-growth.

Alternatively, graded SiGeSn layer 1002 can be formed using a low-temperature SiGeSn epitaxy with tin gaseous or liquid precursor. Example of gaseous precursor includes tin deuteride (SnD$_4$), and examples of liquid precursors include tetramethyl tin [Sn(CH$_3$)$_4$] and stannic chloride (SnCl$_4$).

The layers 902 and 1002 can be doped via an additional ion implantation of p-type dopant such as B, BF$_2$, Al, and/or Ga. The implantation of these ions can be conducted concurrently with the implantation of tin ions and prior to conducting fast re-crystalizing annealing process. Alternatively, the implantation of dopant ions can be conducted after growing SiGeSn layer by epitaxy followed by a fast annealing process suitable for forming and preserving doped metastable SiGeSn alloy.

While the layer 1002 is shown within the top portion of layer 902 within the cavity 801, layer 902 can be also formed within the top portion of exposed source/drain regions 202 within the cavity 801, if the source/drain SiGe material has concentration of Ge in excess of 50%. Further, the concentration of Ge in the SiGe layers 902 and 1002 can be locally increased by processes other than epitaxial deposition processes including Ge ion implantation processes, Ge condensation processes, and Ge surface segregation processes.

Figure 11:
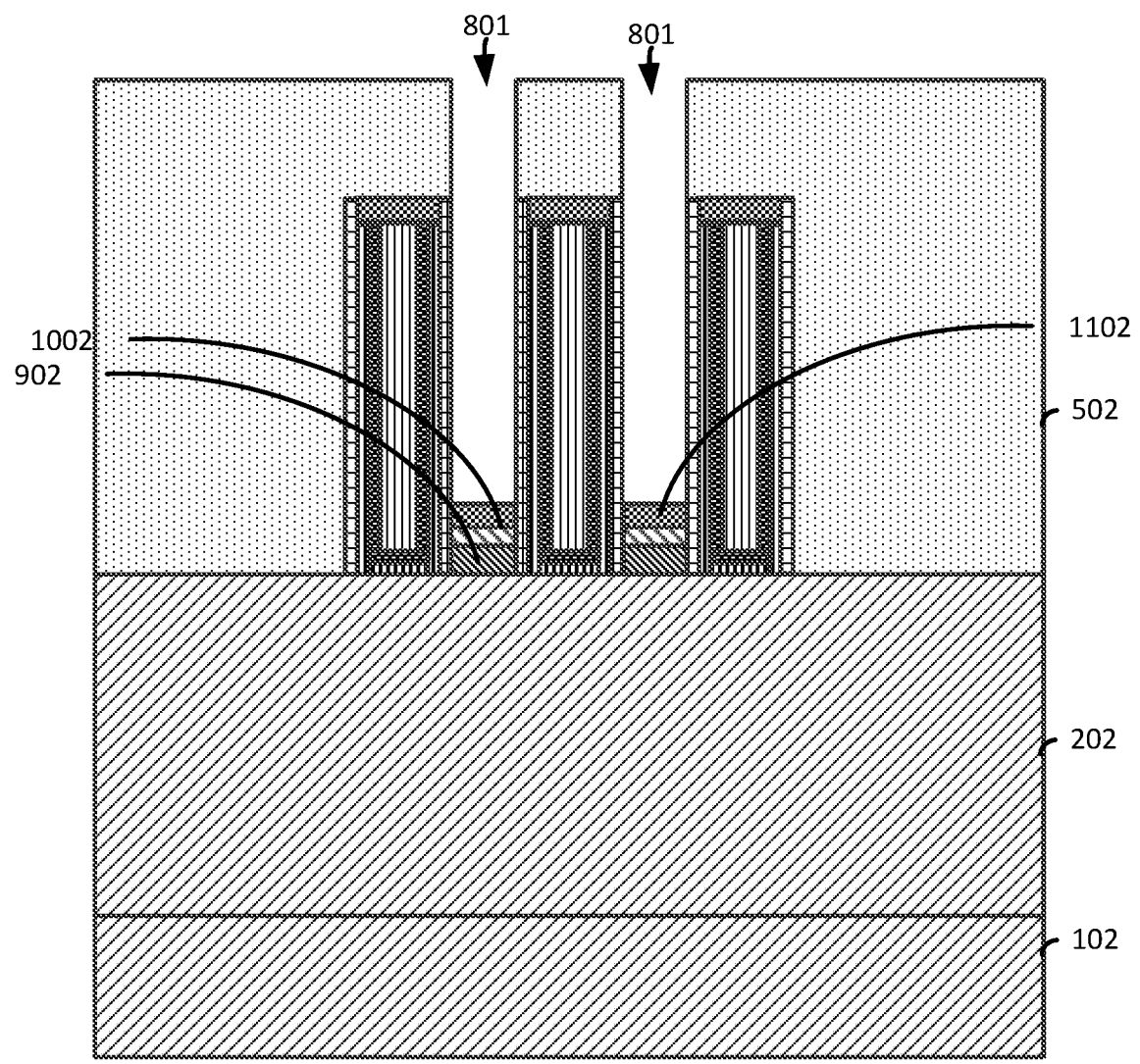

FIG. 11 illustrates a cut-away view following the formation of a trench layer 1102. The trench layer 1102 in the illustrated embodiment is formed in the cavity 801 using, for example, an epitaxial growth process that forms a layer of Ge over the alloyed layer 1002. The purpose of this layer is to pin the Fermi metal layer to the Ge valence band enabling a low contact resistance between the metallic interconnect and the Ge semiconductor.

Epitaxial germanium 1102 can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial germanium can be doped during deposition (in-situ doped) by adding dopants p-type dopants (e.g., boron or gallium). Precursors that enable low-temperature, selective deposition are highly preferred (but not a necessity) due to a temperature-sensitive gate stack 701. The temperature-sensitive gate stack 701 limits the temperature of the epitaxial process to about 550 C, with the deposition temperatures of less than 500 C being preferred (but not a necessity). Due to this temperature limitation, germane or digermane as a germanium precursor are highly preferred (but not a necessity). Due to low solubility of boron in pure Ge, Al and Ga dopants are highly preferred (but not a necessity). Introduction of Al and Ga via in-situ doping is limited but can be accomplished via surface ion implantation.

Figure 12:
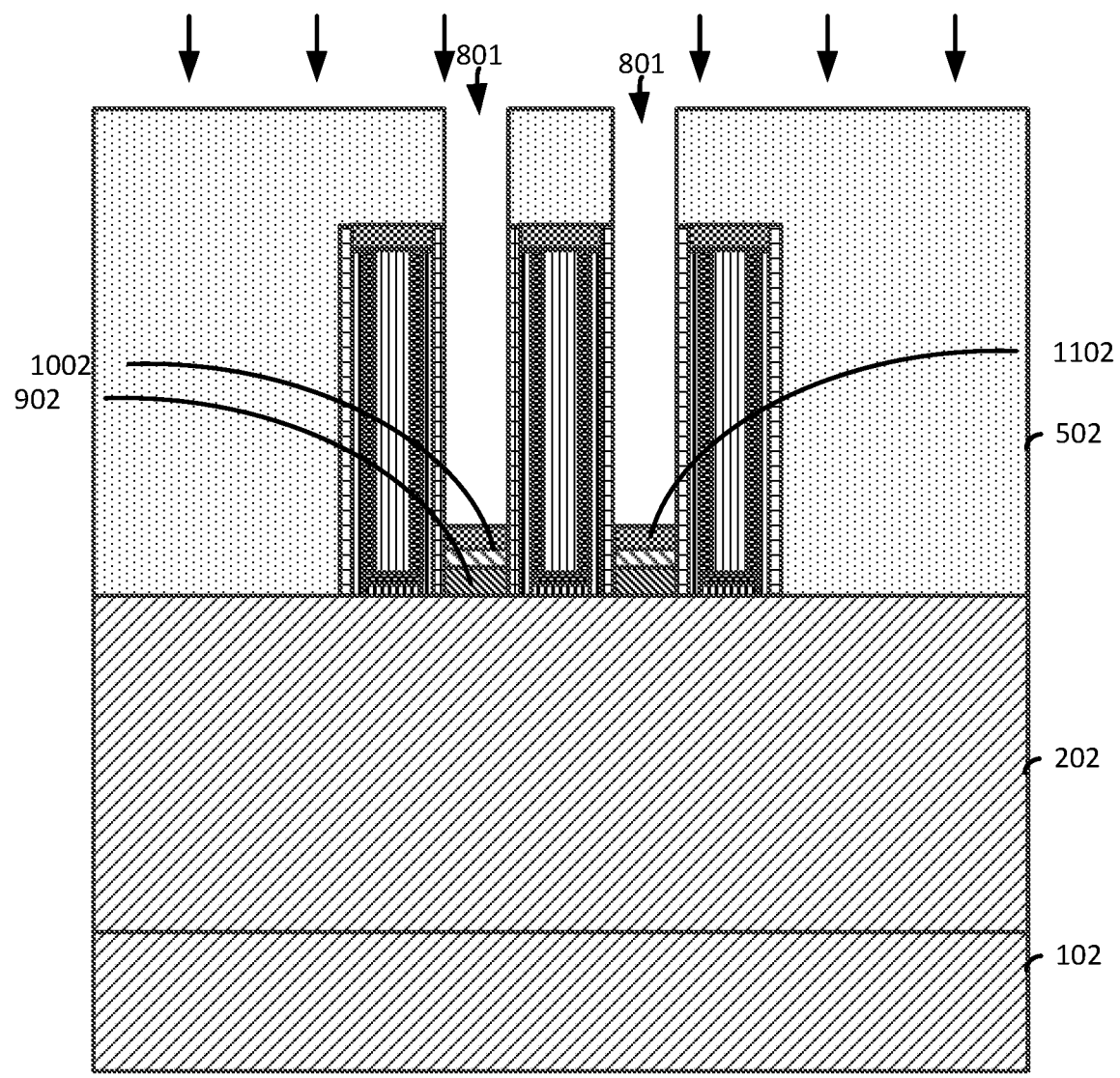

FIG. 12 illustrates a cut-away view following an implantation process, for example, a Ga or Al implantation process followed by a solid or liquid phase epitaxy process that re-crystalizes the trench layer 1102 forming a metastable Ge:Ga or Ge:Al semiconductor-dopant alloys. The duration and temperature of this anneal process is selected to preserve metastable SiGeSn material in layer 1002 while enabling re-crystallization of layer 1102. In some embodiments, the anneal can be a laser anneal with the duration from about 100 microseconds to about 1 millisecond and peak temperature of below 900 C. In another embodiment, the anneal can be a nanosecond laser anneal with the duration from about 10 nanoseconds to about 1 microsecond and peak temperature above the melting point of pure Ge (~940 C) but below the melting point of SiGeSn alloy. In this case, the SiGeSn alloy is selected to have a melting point of above 1000 C.

Figure 13:
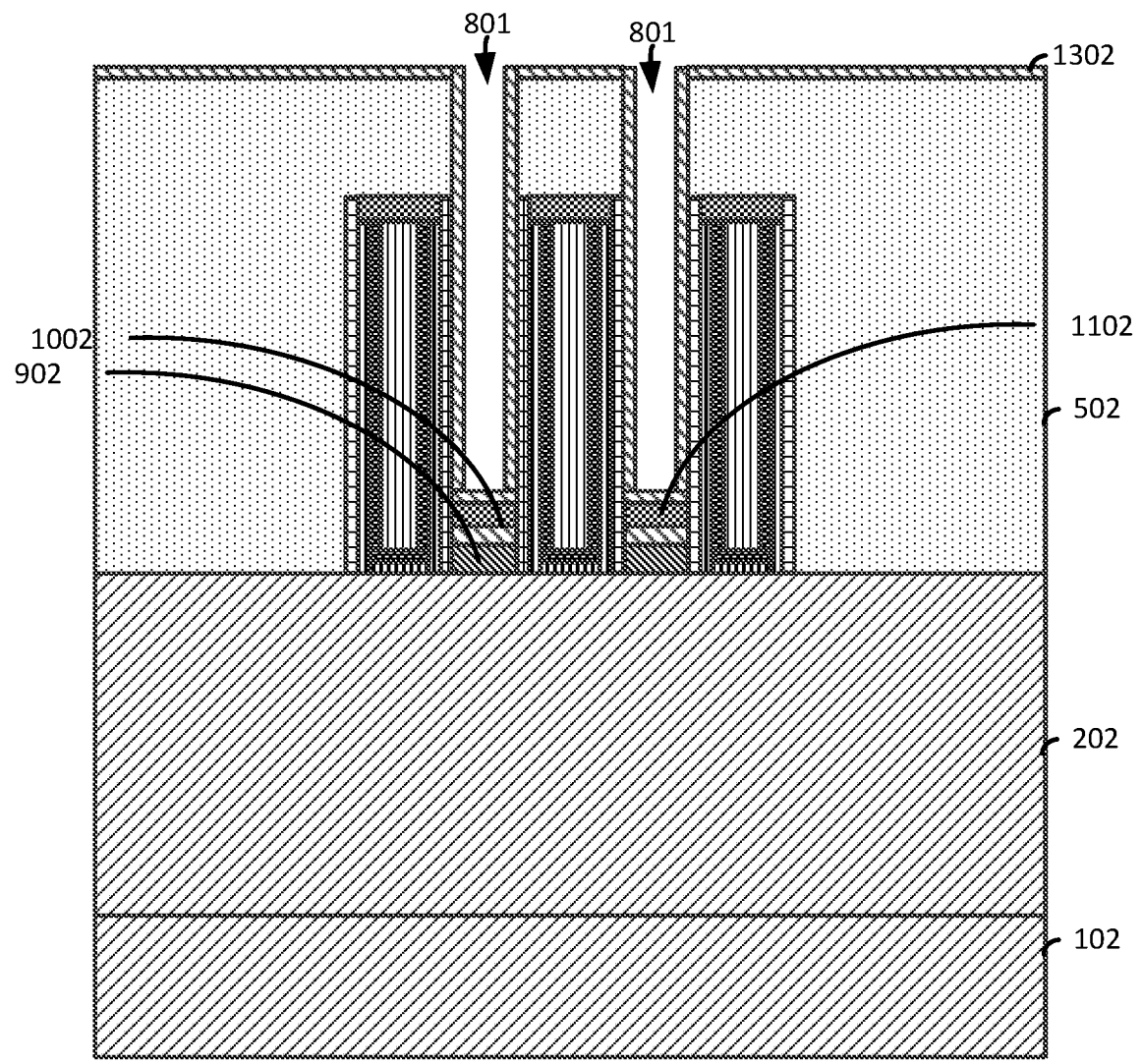

FIG. 13 illustrates a cut-away view following the deposition of a metallic liner layer 1302 over exposed portions of the inter-level dielectric layer 502 and over the trench layer 1102 in the cavities 801. In the illustrated exemplary embodiment, the liner layer 1302 includes, for example, a titanium metal followed by a metal-nitride material such as $TiN_x$.

The liner 1302 is annealed to form a titanium germanide $TiGe_x$ or germo-silicide $TiSi_yGe_x$ at the interface of layers 1302 and 1102. The duration and temperature of this "silicidation" anneal process is selected to preserve metastable materials in layers 1002 and 1102 while forming metallic germo-silicide at the interface of layers 1302 and 1102. In some embodiments, the anneal is a millisecond anneal with the duration from about 100 microseconds to about 1 millisecond and peak temperature of from 700 C to 900 C. This "silicidation" anneal can be conducted immediately after forming liner 1302 or after completing contact structure as shown in FIGS. 14-15.

Figure 14:
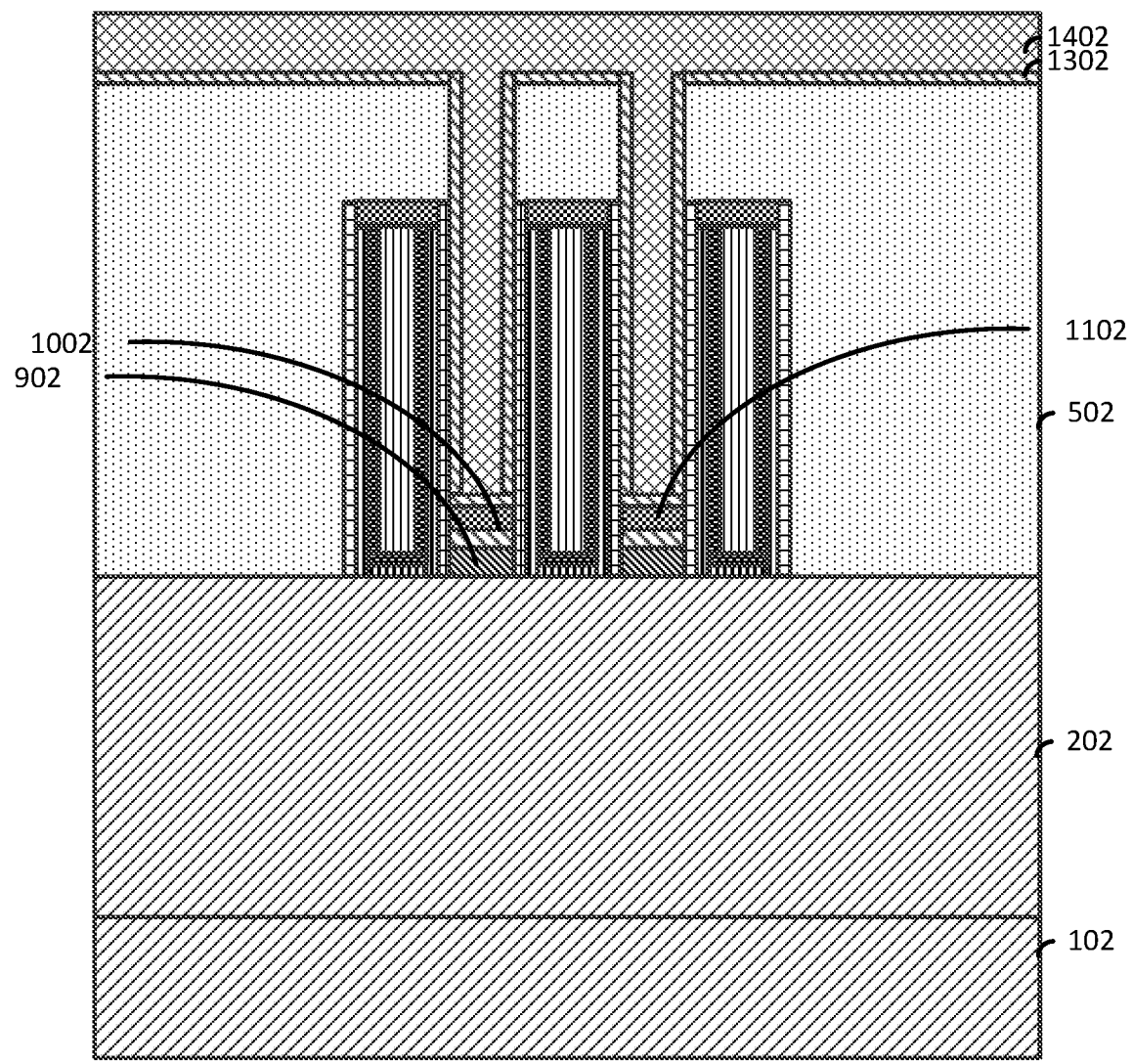

FIG. 14 illustrates a cut-away view of the resultant structure following the deposition of a conductive contact material 1402 over the liner layer 1302. The conductive contact material 1402 is deposited in the cavities 801 (of FIG. 13). The conductive metallic material can include any suitable metallic conductive material including, for example, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), other metallic-like interconnect materials such carbon nanotube, graphene, or any suitable combination of these materials.

Figure 15:
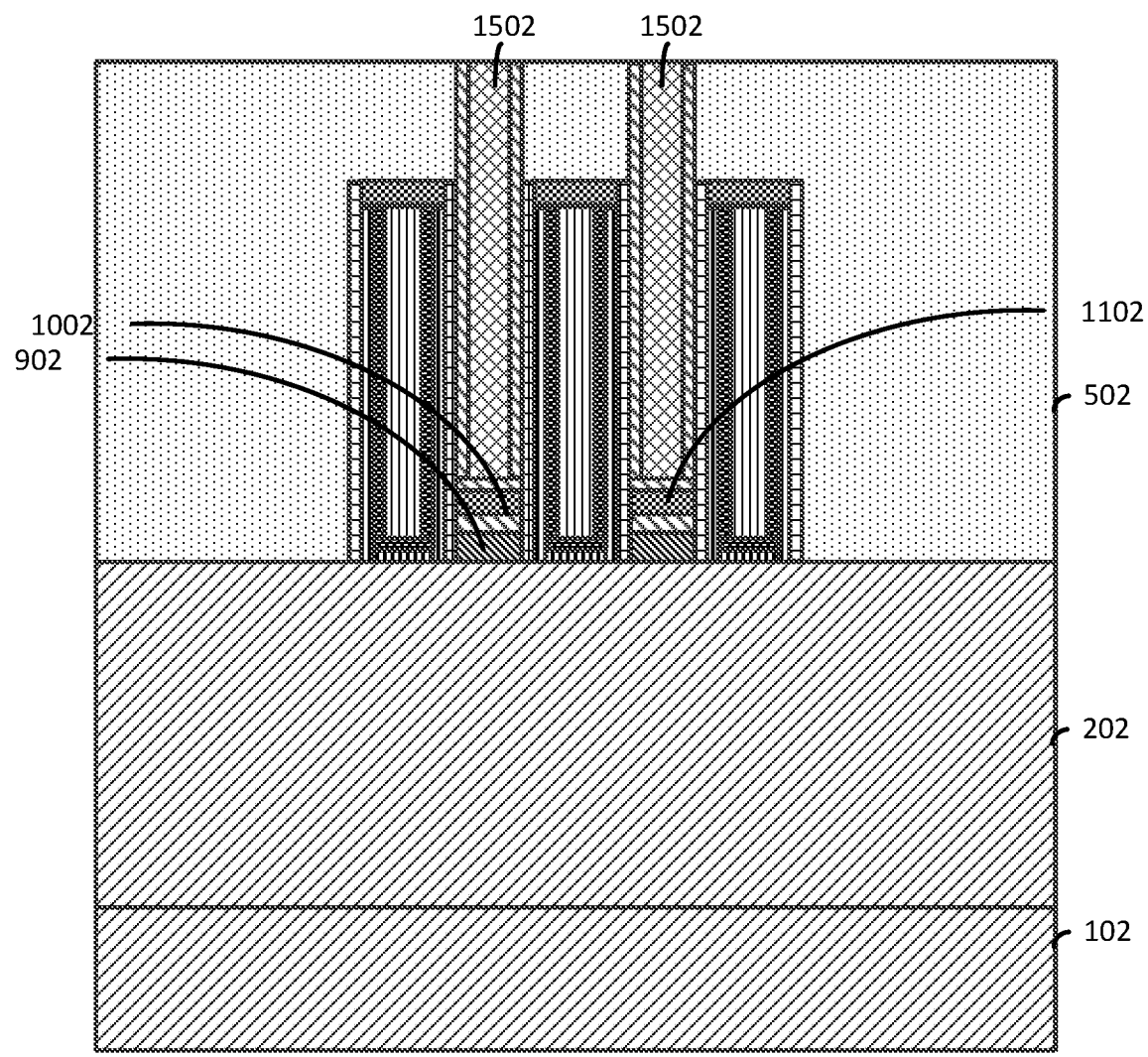

FIG. 15 illustrates a cut-away view following a planarization process that removes overburdened materials and forms conductive contacts 1502. The planarization process can include for example, a chemical mechanical polishing process. Following the planarization process, an annealing process can be performed, as discussed above.

The resultant structure of FIG. 15 includes a trench source/drain region 902 that includes a doped SiGe material (e.g., SiGe:B, SiGe:Ga, SiGe:Al) with Ge content in excess of 50% arranged on the fin 202 that has a lower Ge content, an alloyed layer 1002 on the trench source/drain region 902 that includes a metastable SiGeSn material (e.g., SiGe:Sn) with the tin Sn concentration from about 1 atomic % to about 10 atomic % and increasing toward the top of layer 1002, and a trench layer 1102 that includes highly doped Ge material (e.g., Ge:Ga or Ge:Al). The combined thickness of semiconductor layers 902, 1002, and 1102 is preferably (but not a necessity) less than the width (smaller dimension) of contact trench opening 801 and preferably (but not a necessity) less than 20 nm. Thinner stack of layers 902, 1002, and 1102 reduces bulk series parasitic resistance and stabilizes any metastable material created within. The metallic liner layer 1302 is arranged on the trench layer 1102, and a conductive contact 1502 is arranged on the liner layer 1302. The illustrated exemplary embodiment reduces the valance band offset between the trench source/drain region 902 and the doped layer 1102 to improve the contact resistance (external resistance) of the semiconductor device.

FIGS. 16-22 illustrate an alternate exemplary method for forming source/drain region contacts in a semiconductor device.

Figure 16:
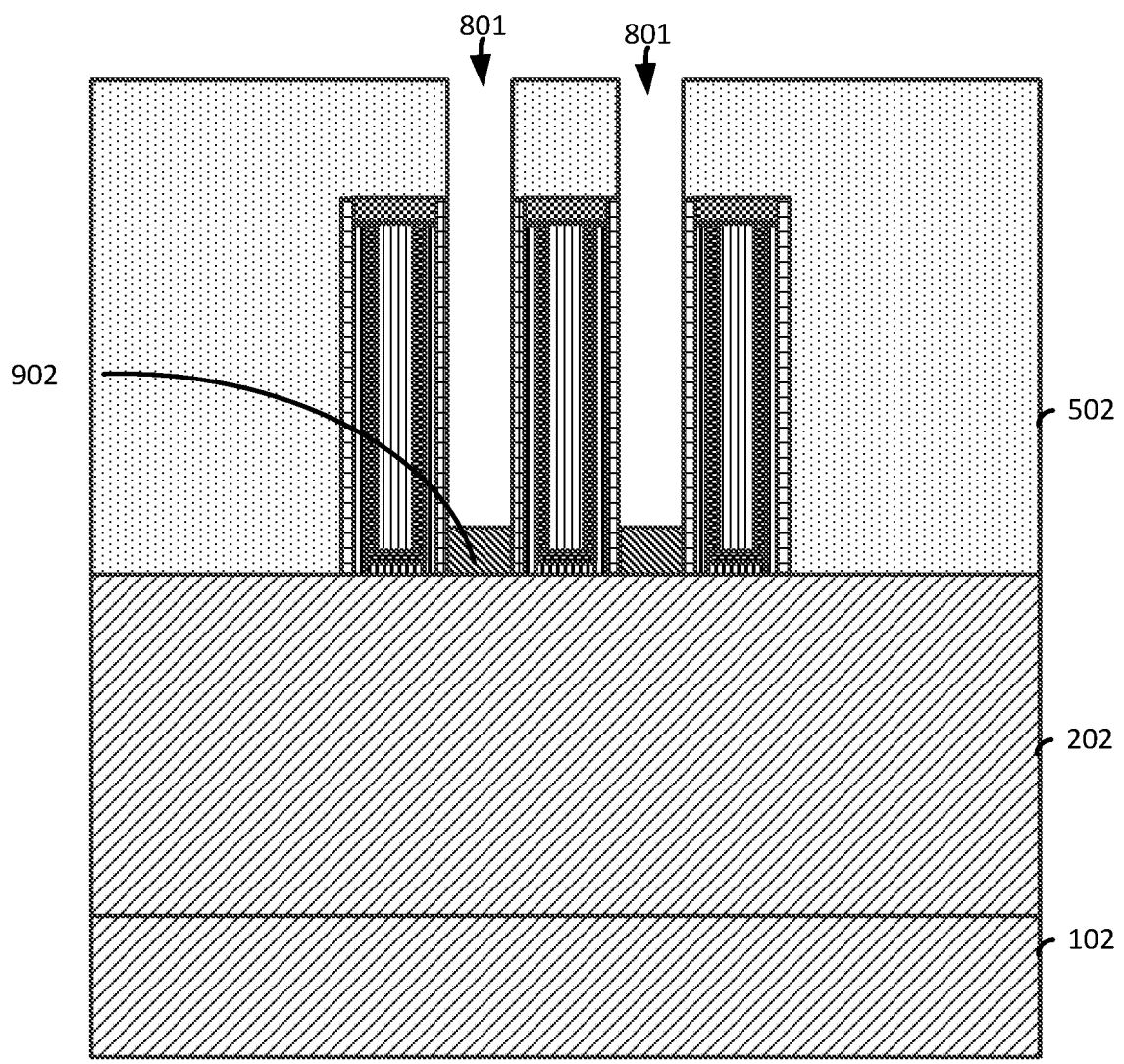
FIGS. 16-22 illustrate an alternate exemplary method for forming source/drain region contacts in a semiconductor device.

FIG. 16 illustrates a cut-away view following the formation of trench source/drain region 902 in the cavities 801. The trench source/drain region 902 is formed in a similar manner as described above in FIG. 9.

Figure 17:
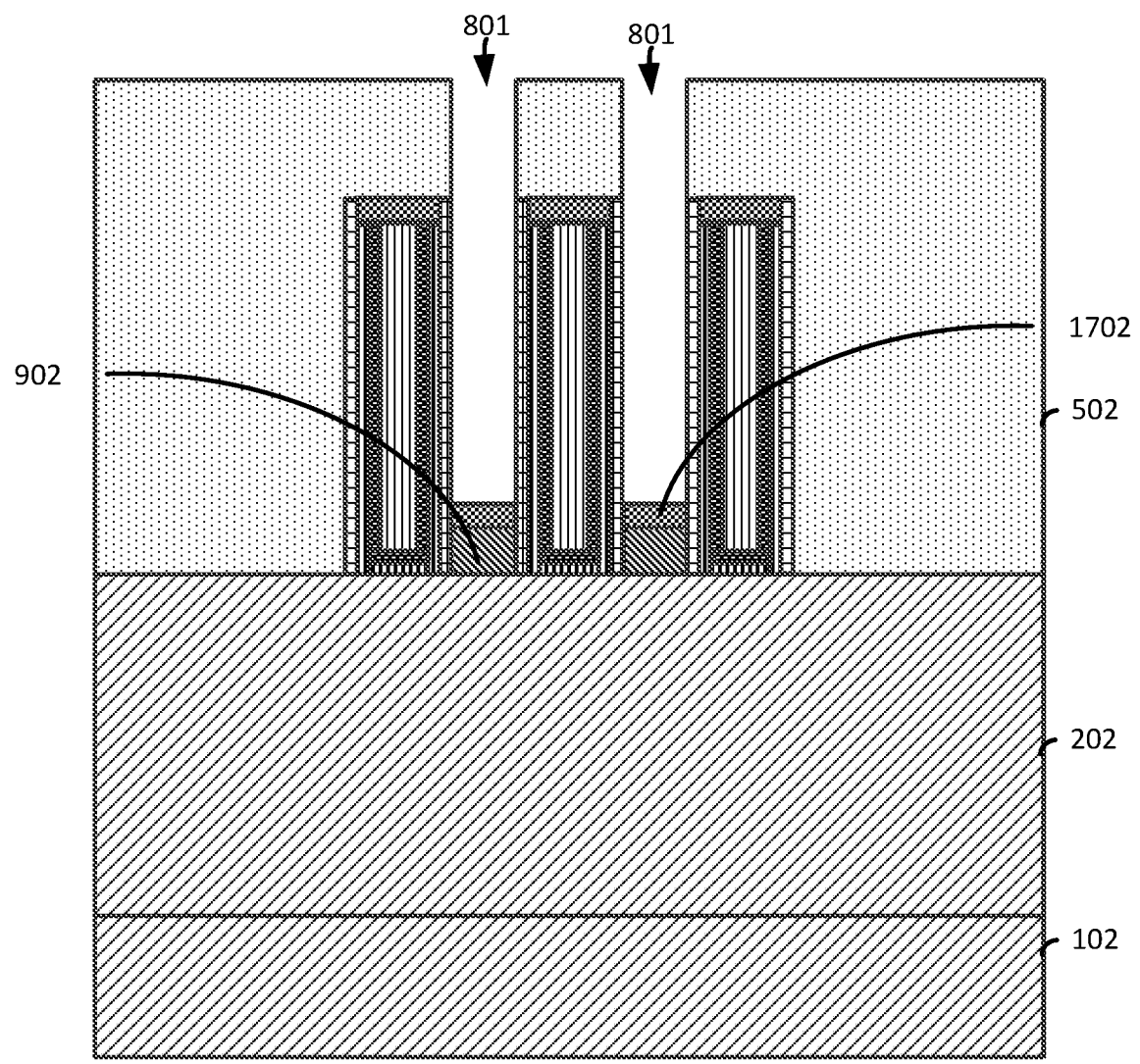

FIG. 17 illustrates a cut-away view following the deposition of a trench layer 1702 over the trench source/drain regions 902 in the cavities 801. The trench layer 1702 is similar to the trench layer 1102 described above in FIG. 11.

Figure 18:
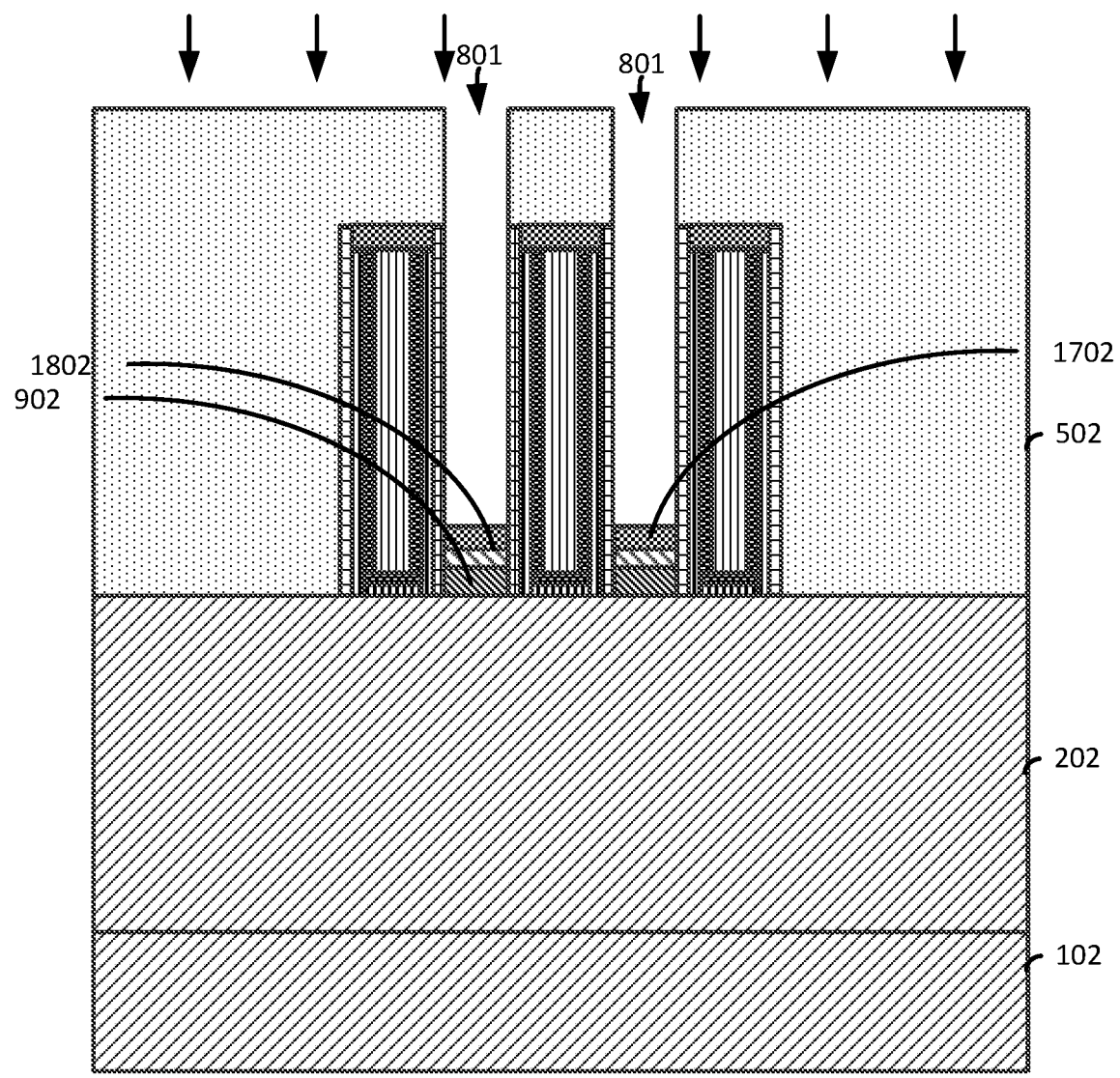
Figure 19:
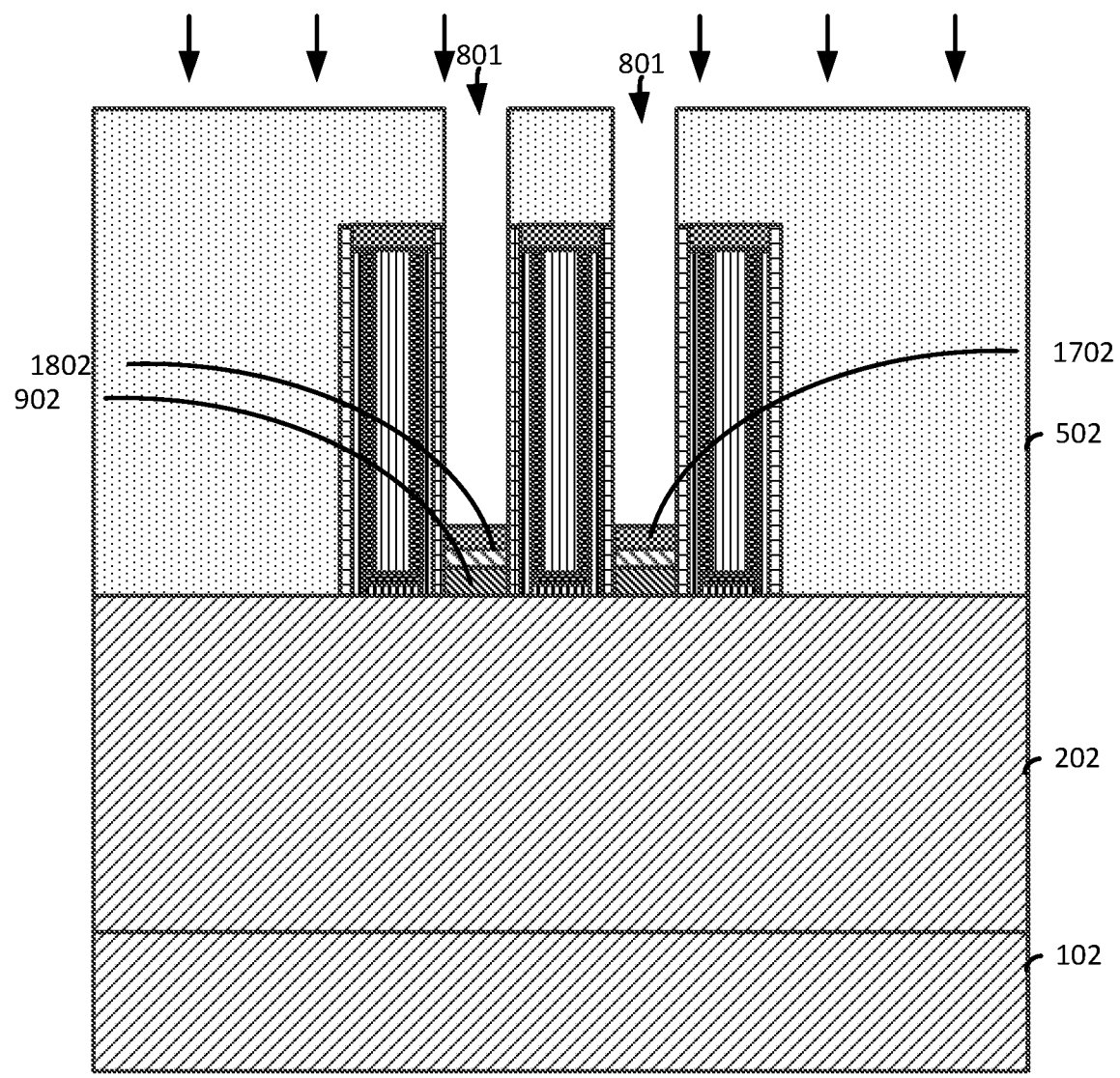

FIG. 18 illustrates a cut-away view following an ion implantation process that implants Sn ions into the cavities 801 to form an alloyed layer 1802 that includes SiGe:Sn material near the interface between layers 902 and 1702. The energy of tin (Sn) ion is selected such that the peak concentration of implanted tin (Sn) ions occurs at the interface between trench layer 1702 and the source/drain region material 902. In some embodiments, the tin (Sn) ion energy is selected to be from 5 keV to about 15 keV depending on the thickness of layer 1702. The dose of tin (Sn) ions is selected to be from $10^{15}$ $cm^{-2}$ to $10^{16}$ $cm^{-2}$ to yield peak concentration of tin (Sn) at from 1 atomic % to about 10 atomic %. Additional dopant ions such B, Ga, or Al can be implanted at this step to increase p-type doping in layers 902, 1702, 1802. This is illustrated in FIG. 19. After implantation processes, the layers 902, 1702, and 1802 may be fully or partially amorphized. In the illustrated exemplary embodiment, following the ion implantation process, an annealing process can be performed to re-crystallize these layers forming metastable tin-based alloy SiGe:Sn in layer 1802. In order to create and preserve this metastable alloy, a very fast annealing process must be used such as, for example, a laser annealing process that has duration of less than 1 millisecond and enables crystal re-growth while preserving the metastable SiGeSn material of the layer 1802. The layers 902 and 1702 recrystalize back into a crystalline state.

Figure 20:
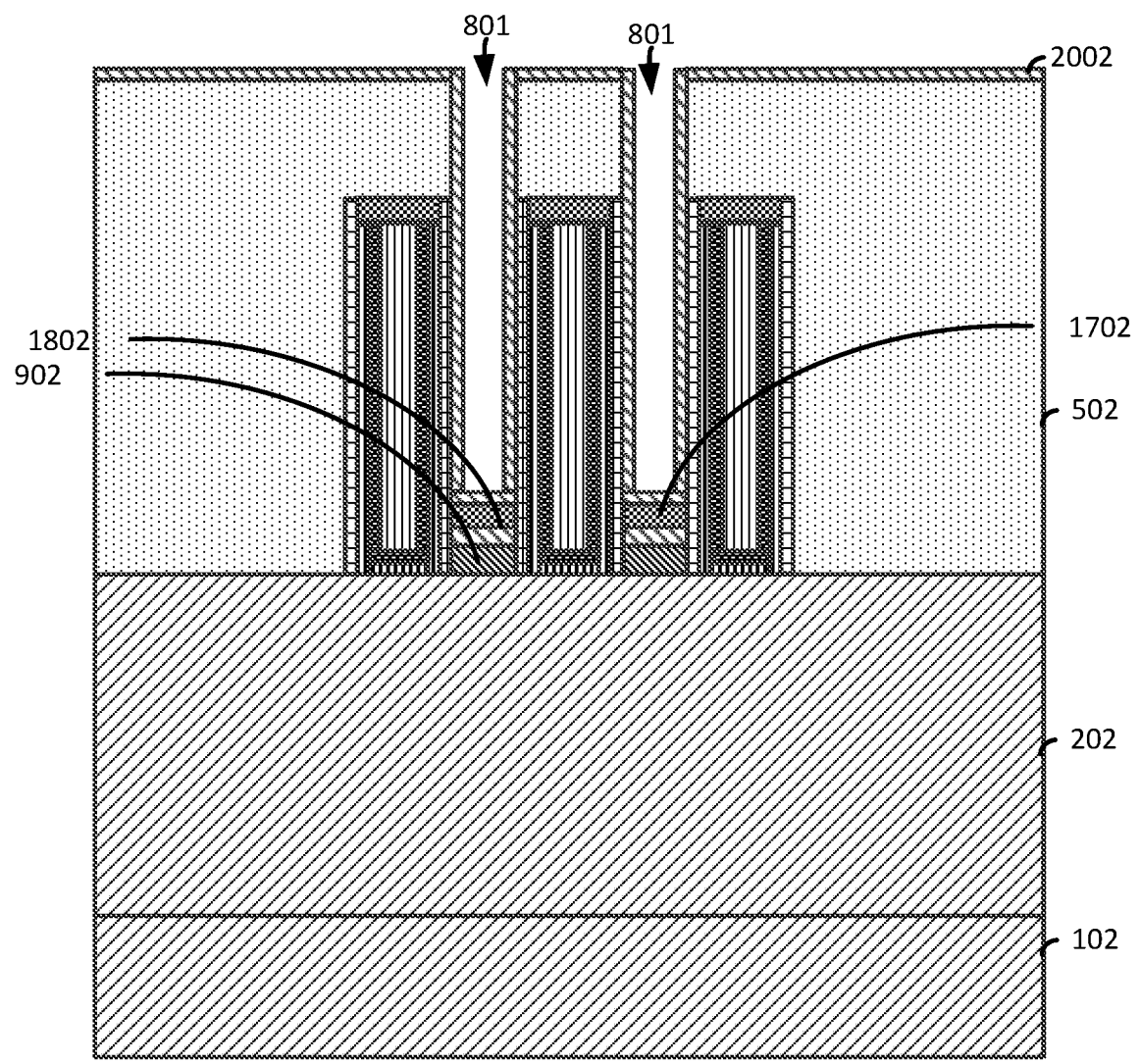

FIG. 20 illustrates a cut-away view following the deposition of a metallic liner layer 2002 over exposed portions of the inter-level dielectric layer 502 and over the trench layer 1702 in the cavities 801. In the illustrated exemplary embodiment, the liner layer 2002 includes, for example, a titanium metal followed by metallic nitride material such as $TiN_x$.

Figure 21:
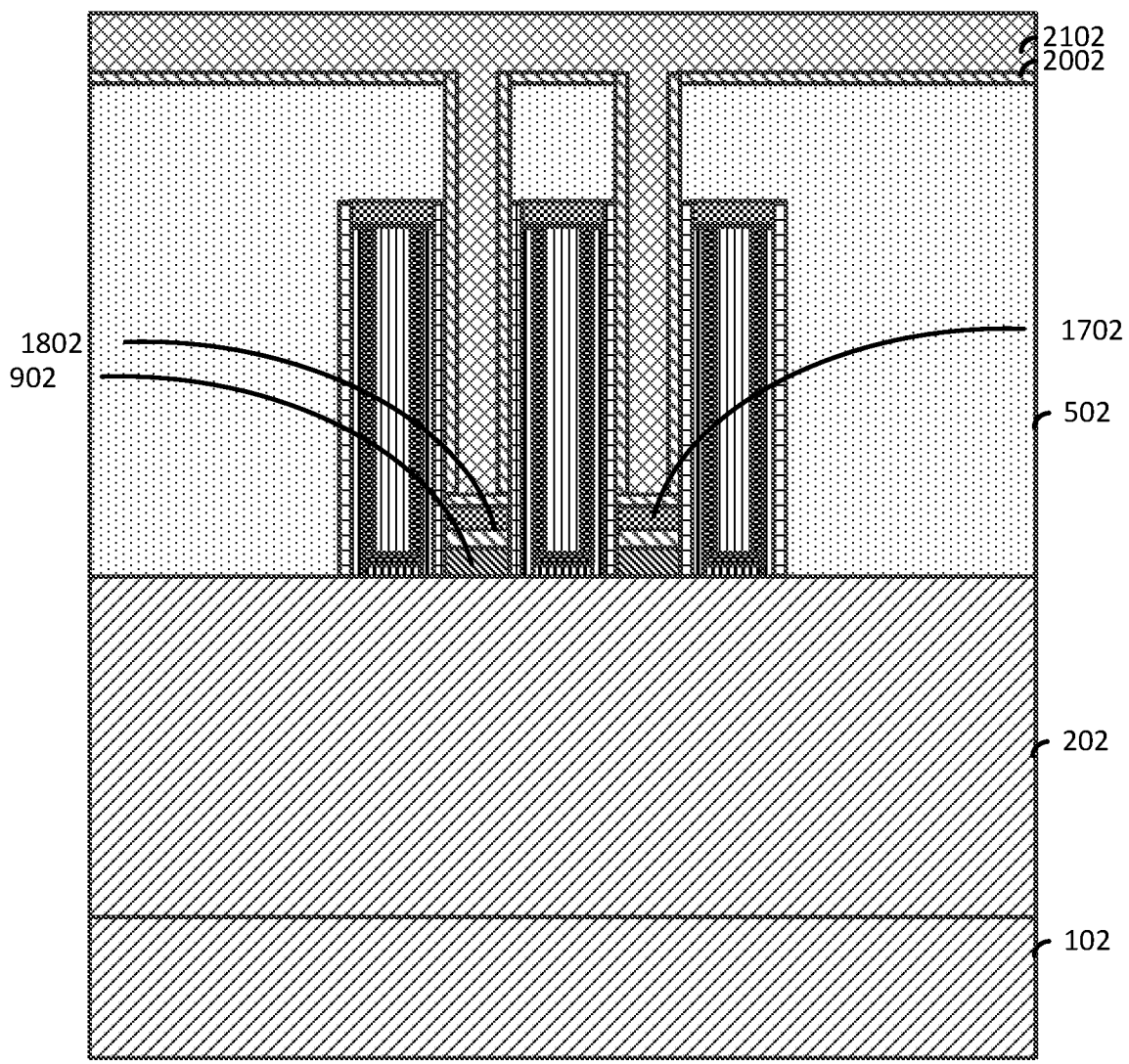

FIG. 21 illustrates a cut-away view of the resultant structure following the deposition of a conductive contact material 2102 over the metallic liner layer 2002. The conductive contact material 2102 is deposited in the cavities 801 (of FIG. 19).

Figure 22:
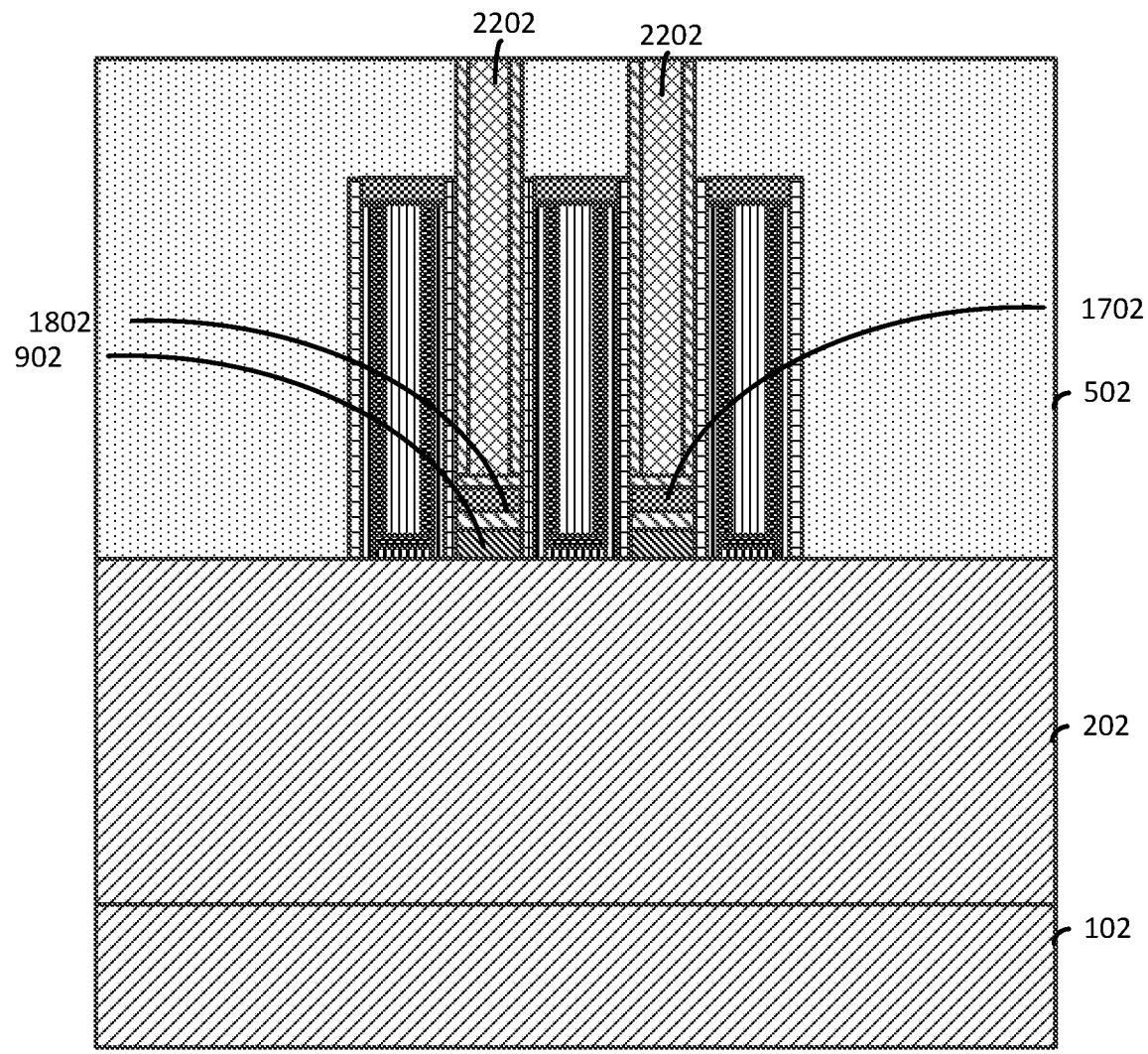

FIG. 22 illustrates a cut-away view following a planarization process that removes overburdened materials and forms conductive contacts 2202. The planarization process can include for example, a chemical mechanical polishing process. Following the planarization process, a millisecond "silicidation" annealing process can be performed to form germanide $TiGe_x$ or germo-silicide $TiSi_yGe_x$ at the interface between layer 2002 and 1702.

The resultant structure of FIG. 22 is similar to the resultant structure of FIG. 15, and includes a trench source/drain region 902 that includes a doped SiGe material (e.g., SiGe:B, SiGe:Ga, SiGe:Al) with Ge content in excess of 50% arranged on the fin 202 that has a lower Ge content, a tin-alloyed layer 1802 on the source/drain region 902 that includes a metastable SiGeSn material (e.g., SiGe:Sn), with the tin (Sn) concentration from about 1 atomic % to about 10 atomic % peaking in between layers 902 and 1702 and decaying toward the top surface of layer 1702 and the bulk of layer 902, and a trench layer 1702 that includes highly doped Ge material (e.g., Ge:Ga or Ge:Al). The combined thickness of semiconductor layers 902, 1702, and 1802 is preferably (but not a necessity) less than the width (smaller dimension) of contact trench opening 801 and preferably (but not a necessity) less than 20 nm. Thinner stack of layers 902, 1702, and 1802 reduces bulk series parasitic resistance and stabilizes any metastable material created within. A metallic liner layer 2002 is arranged on the trench layer 1702, and the conductive contact 2202 is arranged on the liner layer 2002. The illustrated exemplary embodiment reduces the valance band offset between the trench source/drain region 902 and the doped layer 1702 to improve the contact resistance (external resistance) of the semiconductor device.

While aspects of the exemplary embodiment are shown and described with respect to a p-type finFET (pFINFET), it is to be understood that aspects of the present invention may be employed with different geometrical orientations and shapes of transistor active region or its channel such as planar, surround-gate FETs, multiple-gate FETs, nano-wire or nano-sheet FETs, and vertical FETs.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
   an inter-level dielectric layer having a contact trench creating an exposed portion of a semiconductor substrate through the inter-level dielectric layer, wherein a gate stack is on the semiconductor substrate, wherein the inter-level dielectric layer is adjacent to the gate stack and the semiconductor substrate;
   a trench source/drain region in the contact trench such that the trench source/drain region is on the exposed portion of the semiconductor substrate;
   an alloyed layer on top of the trench source/drain region, the alloyed layer including tin and a source/drain material of the trench source/drain region;
   a trench layer in the contact trench such that the trench layer is on top of the alloyed layer, the trench layer comprising Ge; and
   a metallic liner layer on the trench layer and the inter-level dielectric layer.

2. The semiconductor device of claim 1, wherein a conductive contact is formed on top of the metallic liner layer so as to fill the contact trench.

3. The semiconductor device of claim 1, wherein the source/drain material is a semiconductor material.

4. The semiconductor device of claim 1, wherein the source/drain material comprises SiGe.

5. The semiconductor device of claim 1, wherein the source/drain material comprises SiGe with a Ge content higher than a Ge content of the semiconductor substrate.

6. The semiconductor device of claim 5, wherein the Ge content of the source/drain material is about 50% to 80% higher than the Ge content of the semiconductor substrate.

7. The semiconductor device of claim 1, wherein a concentration of the tin in the alloyed layer is graded with a higher concentration towards the surface and a lower concentration into a middle of the alloyed layer.

8. The semiconductor device of claim 1, wherein a surface concentration of the tin in the alloyed layer is from about 1 atomic % to 10 atomic %.

9. The semiconductor device of claim 7, wherein ion implantation of the tin is utilized to provide a concentration grading of the alloyed layer having the higher concentration towards the surface and the lower concentration in a middle of the alloyed layer.

10. The semiconductor device of claim 1, wherein the alloyed layer is formed by an ion implantation process of tin.

11. The semiconductor device of claim 10, wherein energy of the ion implantation process ranges from about 1 keV to about 10 keV.

12. The semiconductor device of claim 10, wherein an amount of the tin during the ion implantation process ranges from about $10^{15}$ $cm^{-2}$ to $10^{16}$ $cm^{-2}$.

13. The semiconductor device of claim 10, wherein the alloyed layer is a metastable alloyed layer as a result of an annealing process performed after the ion implantation process.

14. The semiconductor device of claim 13, wherein the alloyed layer is a SiGeSn alloy.

15. The semiconductor device of claim 1, wherein the alloyed layer on top of the trench source/drain region is formed by:
   performing ion implantation of the tin into the source/drain material of the trench source/drain region; and
   performing a laser annealing process that has a duration of less 1 millisecond thereby enabling crystal re-growth of the source/drain material and the alloyed layer having been formed on top of the source/drain material, wherein the alloyed layer is metastable.

16. The semiconductor device of claim 1, wherein the alloyed layer on top of the trench source/drain region is formed by:
performing ion implantation of the tin into the source/drain material of the trench source/drain region; and
performing nanosecond-scale laser melt annealing that liquefies the tin implanted source/drain material, followed by liquid phase epitaxial re-growth of the source/drain material and the alloyed layer having been formed on top of the source/drain material, wherein the alloyed layer is metastable.

17. The semiconductor device of claim 1, wherein the trench source/drain region is doped with B.

18. The semiconductor device of claim 1, wherein the trench source/drain region is doped with $BF_2$.

19. The semiconductor device of claim 1, wherein the trench source/drain region is doped with Al.

20. The semiconductor device of claim 1, wherein the trench source/drain region is doped with Ga.

\* \* \* \* \*